US008263499B2

(12) United States Patent
Honda et al.

(10) Patent No.: US 8,263,499 B2
(45) Date of Patent: Sep. 11, 2012

(54) PLASMA PROCESSING METHOD AND COMPUTER READABLE STORAGE MEDIUM

(75) Inventors: Masanobu Honda, Nirasaki (JP); Michiko Nakaya, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 650 days.

(21) Appl. No.: 12/414,920

(22) Filed: Mar. 31, 2009

(65) Prior Publication Data
US 2009/0275207 A1 Nov. 5, 2009

Related U.S. Application Data

(60) Provisional application No. 61/109,959, filed on Oct. 31, 2008.

(30) Foreign Application Priority Data

Mar. 31, 2008 (JP) ................................. 2008-091490
Dec. 15, 2008 (JP) ................................. 2008-318663

(51) Int. Cl.
*H01L 21/302* (2006.01)
*H01L 21/461* (2006.01)

(52) U.S. Cl. ........ 438/706; 438/707; 438/708; 438/709; 438/717; 438/725

(58) Field of Classification Search .................. None
See application file for complete search history.

(56) References Cited

U.S. PATENT DOCUMENTS

| 7,354,866 B2* | 4/2008 | Kumar et al. | 438/736 |
| 7,642,193 B2* | 1/2010 | Ventzek et al. | 438/709 |
| 7,829,469 B2* | 11/2010 | Chen et al. | 438/714 |
| 7,910,907 B2* | 3/2011 | Lung | 257/4 |
| 2005/0214683 A1 | 9/2005 | Nishimura et al. | |
| 2007/0165355 A1 | 7/2007 | Sato et al. | |
| 2008/0035605 A1* | 2/2008 | Takahashi | 216/58 |

FOREIGN PATENT DOCUMENTS

| CN | 1992164 A | 7/2007 |
| JP | 2005-243681 | 9/2005 |

OTHER PUBLICATIONS

Office Action issued Jul. 29, 2010, in Chinese Patent Application No. 200910129594.5 with English translation.

* cited by examiner

Primary Examiner — Duy Deo
(74) Attorney, Agent, or Firm — Oblon, Spivak, McClelland, Maier & Neustadt, L.L.P.

(57) ABSTRACT

A plasma etching method includes disposing first electrode and second electrodes; preparing a part in a processing chamber; supporting a substrate by the second electrode to face the first electrode; vacuum-evacuating the processing chamber; supplying a first processing gas containing an etchant gas into a processing space between the first electrode and the second electrode; generating a plasma of the first processing gas in the processing space by applying a radio frequency power to the first electrode or the second electrode; and etching a film on the substrate by using the plasma. Further, a resist modification process includes vacuum-evacuating the processing chamber; supplying a second processing gas into the processing space; generating a plasma; and applying a negative DC voltage to the part, the part being disposed away from the substrate in the processing chamber and injecting electrons discharged from the part into the resist pattern on the substrate.

21 Claims, 21 Drawing Sheets

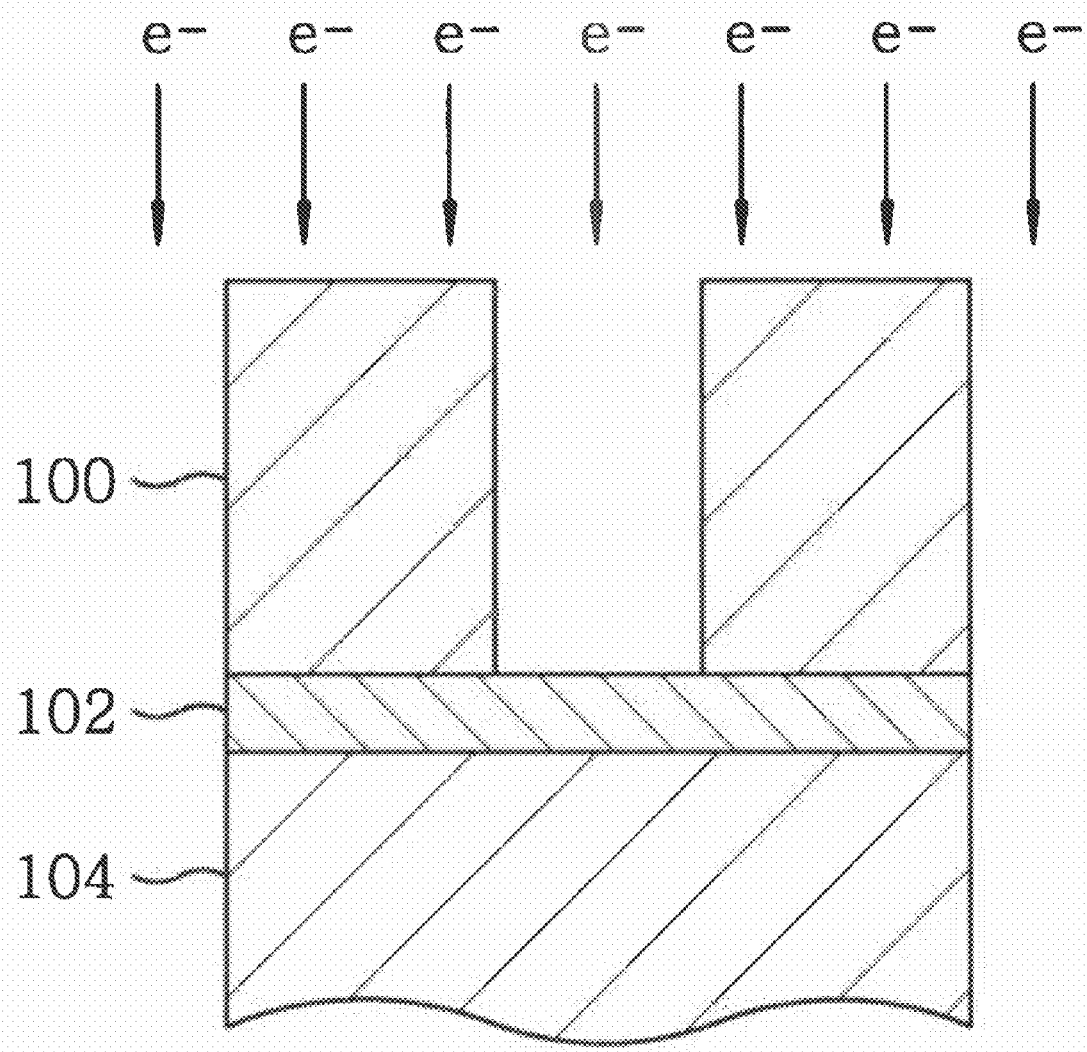

FIG. 5

| $V_{DC}$: NO APPLICATION | $V_{DC} = -500V$ | $V_{DC} = -1000V$ | $V_{DC} = -1500V$ |
|---|---|---|---|
| MODIFIED LAYER DEPTH 0nm(0nm) | MODIFIED LAYER DEPTH 22nm(19nm) | MODIFIED LAYER DEPTH 83nm(62nm) | MODIFIED LAYER DEPTH 173nm(120nm) |

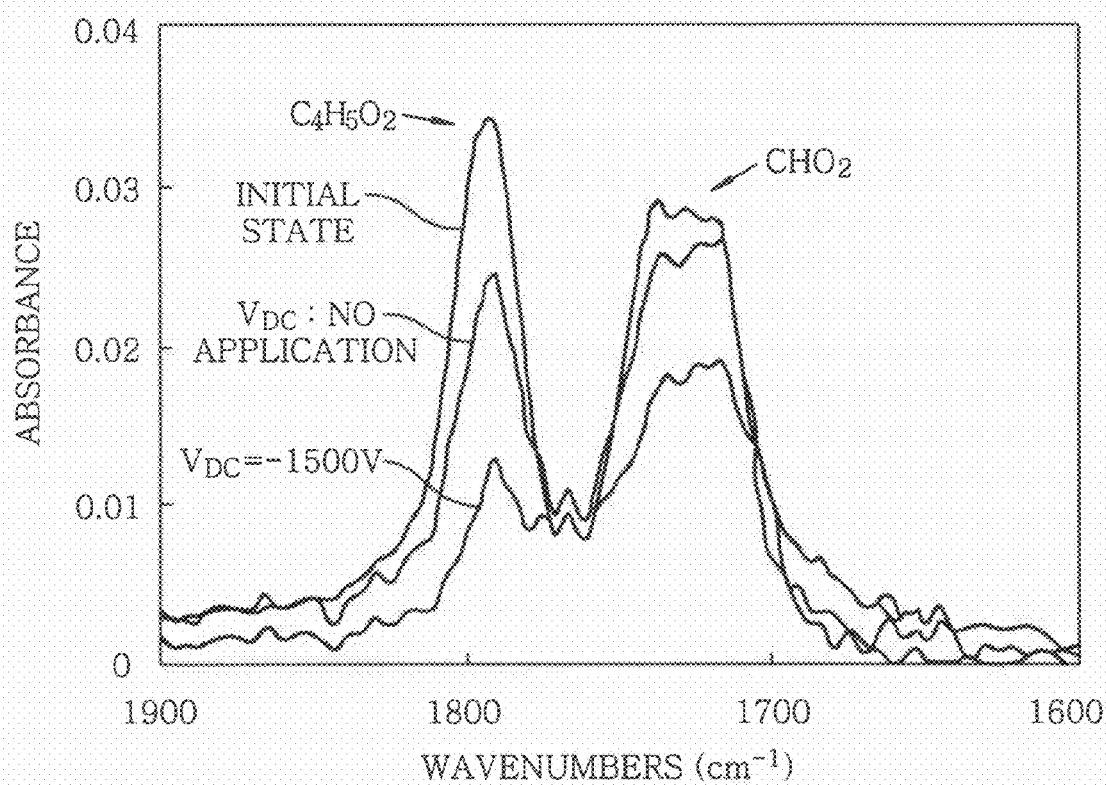

(EMBODIMENT)

(COMPARATIVE EXAMPLE)

PLASMA PROCESSING METHOD AND COMPUTER READABLE STORAGE MEDIUM

FIELD OF THE INVENTION

The present invention relates to a plasma processing method for performing a dry etching process on a substrate to be processed in a capacitively coupled plasma processing apparatus; and, more particularly, to a plasma processing method capable of improving and stabilizing the accuracy of thin film processing by increasing an etching resistance of a resist pattern used as an etching mask and a computer readable storage medium storing a program for executing the plasma processing method.

BACKGROUND OF THE INVENTION

In an etching process of a manufacturing process of a semiconductor device or a flat panel display (FPD), a film on a surface of a substrate to be processed (a semiconductor wafer, a glass substrate or the like) is processed in a desired circuit pattern by using as a mask a resist pattern formed by a lithography technique. Conventionally, a capacitively coupled plasma etching apparatus has been widely used for single-wafer etching.

Generally, in a capacitively coupled plasma etching apparatus, an upper electrode and a lower electrode are arranged in parallel in a vacuum processing chamber, and a substrate to be processed is mounted on the lower electrode. When a radio frequency power is applied between the electrodes, a plasma is generated by a high frequency discharge between the electrodes. Accordingly, the surface of the substrate is etched in a desired pattern by radicals or ions in the plasma.

In a currently most advanced LSI process, an ArF excimer laser exposure technique is used for photolithography, and a chemically amplified resist (ArF resist) suitable for a wavelength (193 nm) of an ArF excimer laser beam is used as a resist. The ArF resist has high sensitivity and high resolution, but provides poor plasma resistance or etching resistance. Further, the patterning is performed in an ultra-fine size, so that resist pattern collapse, surface roughness, or uneven pattern sidewall can occur during plasma etching. Therefore, zigzag or uneven deformation such as poor LER (Line Edge Roughness), LWR (Line Width Roughness) or the like may be caused.

Conventionally, as for a technique for improving etching resistance of an ArF resist, there is known a method for modifying a resist by electron beam irradiation, UV irradiation, $H_2$ or HBr plasma irradiation, ion beam irradiation or the like.

However, the conventional resist modification method requires a processing vessel (chamber) exclusively, thereby resulting in that a cost of apparatus increases while a throughput of the apparatus decreases. If the electron beam irradiation method, the UV irradiation method or the ion beam irradiation method is used before an exposure to light, light transmissivity of the resist pattern is changed because of the resist film quality change, thereby deteriorating the exposure performance. If the ion beam irradiation method is used after an exposure to light, the resist pattern can be easily damaged by an ion impact. If the electron beam irradiation method or the UV irradiation method is used, taper-shaped shrinkage deformation or CD (critical dimension) variation can occur easily in the resist pattern. Moreover, the $H_2$ or HBr plasma irradiation method is disadvantageous in that it is difficult to reproduce the process due to residual hydrogen in the chamber, and also in that operation stability or production yield is poor.

SUMMARY OF THE INVENTION

In view of the above, the present invention provides a plasma processing method for improving and stabilizing the accuracy of thin film processing by increasing an etching resistance of a resist pattern by using a capacitively coupled plasma processing apparatus and a simple and effective resist modification technique, and a computer readable storage medium storing therein a program for performing the method.

In accordance with one aspect of the invention, there is provided a plasma etching method including: disposing a first electrode and a second electrode in parallel to each other with a gap therebetween in a vacuum evacuable processing chamber; preparing a part in the processing chamber; supporting a substrate to be processed by the second electrode to face the first electrode; vacuum-evacuating the processing chamber to a predetermined pressure; supplying a first processing gas containing an etchant gas into a processing space between the first electrode and the second electrode; generating a plasma of the first processing gas in the processing space by applying a radio frequency power to the first electrode or the second electrode; and etching a film to be processed on the substrate by using the plasma while using as a mask a resist pattern formed on the film.

Further, a resist modification process is performed on the substrate in the processing chamber before etching the film and includes: vacuum-evacuating the processing chamber to a desired pressure; supplying a second processing gas into the processing space; generating a plasma of the second processing gas in the processing space by applying the radio frequency power to the first electrode or the second electrode; and applying a negative DC voltage to the part exposed to the plasma, the part being disposed away from the substrate in the processing chamber and injecting electrons discharged from the part into the resist pattern on the substrate to thereby improve an etching resistance of the resist pattern.

In the above plasma processing method, before the film is etched, electrons are injected into the resist pattern on the substrate by using the same hardware, and the portions where the electrons are injected (from a top portion to an inner deep portion) are modified. Since the modification process is performed separately from the original etching process while using the same hardware, the processing conditions can be randomly selected. Especially, it is possible to arbitrarily select an absolute value of a negative DC voltage to be applied to the part, and also possible to arbitrarily control a thickness of the modified layer.

In the resist modification process, an absolute value of the negative DC voltage may be selected so as to inject the electrons discharged from the part into the resist pattern at an energy greater than or equal to about 1000 eV. Further, an absolute value of the negative DC voltage may be selected to be greater or equal to about 1000 V.

Accordingly, the modified layer having a thickness greater than or equal to several tens of nm can be obtained.

Preferably, in the resist modification process, an absolute value of the negative DC voltage is selected so as to inject the electrons discharged from the part into the resist pattern at an energy greater than or equal to about 1500 eV. Further, an absolute value of the negative DC voltage may be selected to be greater or equal to about 1500 V.

As a consequence, the modified layer having a thickness greater than or equal to about 100 nm can be obtained.

It is preferred that, in the resist modification process, the radio frequency power for plasma generation is applied to the first electrode, and an additional radio frequency power for ion attraction is applied to the second electrode at a power lower than or equal to about 50 W. Further, the radio frequency power for plasma generation may be applied to the first electrode without applying a radio frequency power to the second electrode.

At this time, an electric field of the ion sheath above the second electrode is applied in a direction of decreasing the energy of the electrons injected into the resist pattern. Therefore, the self-bias generated on the second electrode may be set as low as possible, preferably lower than or equal to about 100 V. In addition, the additional radio frequency power may be set as low as possible, preferably lower than or equal to about 50 W. More preferably, the additional radio frequency power is set to substantially 0 W, or no radio frequency power is applied to the second electrode.

Preferably, a trimming process for trimming the resist pattern in the processing chamber in a horizontal direction in parallel with a pattern surface is performed between the resist modification process and the etching process of the film. The trimming process may include: vacuum-evacuating the processing chamber; supplying a third processing gas containing an etchant gas into the processing space; generating a plasma of the third processing gas in the processing space by applying the radio frequency to the first electrode or the second electrode; and etching the resist pattern in a desired size by using the plasma.

In this case, the etching resistance or the plasma resistance of the modified layer is improved by the previous resist modification process. Thus, the deformation such as shoulder-shape collapse or the like is suppressed in the resist, thereby realizing highly accurate trimming process with a desired reduced size.

In the plasma processing method of the present invention, the first electrode directly facing the substrate may be typically used as a DC application member. However, other members not directly facing the substrate (e.g., a chamber sidewall) can also be used.

Although the first electrode is preferably made of a Si-containing conductive material, any material may be used depending on an etching process for the film. Further, when the first electrode is made of the Si-containing conductive material, polymer deposition on a surface thereof is prevented. Accordingly, DC conductivity can be stably maintained, and a gas containing halogen gas (e.g., fluorocarbon gas) may be preferably used as a second processing gas for the resist modification.

In accordance with another aspect of the invention there is provided a plasma etching method including: disposing a first electrode and a second electrode in parallel to each other with a gap therebetween in a vacuum evacuable processing chamber; preparing a part in the processing chamber; supporting a substrate to be processed by the second electrode to face the first electrode; vacuum-evacuating the processing chamber to a predetermined pressure; supplying a processing gas containing an etchant gas into a processing space between the first electrode and the second electrode; generating a plasma of the etching gas in the processing space by applying a radio frequency to the first electrode or the second electrode; and etching a film to be processed on the substrate by using the plasma while using as a mask a resist pattern formed on the film.

While the film is being etched in the processing chamber, a negative DC voltage is applied to the part exposed to the plasma, the part being disposed away from the substrate and electrons discharged from the part are injected into the resist pattern to thereby improve an etching resistance of the resist pattern. Further, a gas pressure in the processing chamber and etching time are selected so as to etch the resist pattern in a desired size in a horizontal direction in parallel with a pattern surface during the etching process of the film.

In the above plasma processing method, while the original plasma etching process is performed, electrons are injected into the resist pattern used as an etching mask on the substrate by using the same plasma in the same processing chamber. Due to the modification effect, the etching resistance thereof increases, and an etching selectivity against the mask is improved. Further, a desired trimming process can be performed on the resist pattern by using a gas pressure and etching time as parameters.

In accordance with still another aspect of the invention there is provided a plasma etching method including: disposing a first electrode and a second electrode in parallel to each other with a gap therebetween in a vacuum evacuable processing chamber; preparing a part in the processing chamber; supporting a substrate to be processed by the second electrode to face the first electrode; vacuum-evacuating the processing chamber to a predetermined pressure; supplying a processing gas containing an etchant gas into a processing space between the first electrode and the second electrode; generating a plasma of the processing gas in the processing space by applying a radio frequency power to the first electrode or the second electrode; and etching a film to be processed on the substrate by using the plasma while using as a mask a resist pattern formed on the film.

While the film is being etched in the processing chamber, a negative DC voltage is applied to the part exposed to the plasma, the part being disposed away from the substrate in the processing chamber and electrons discharged from the part are injected into the resist pattern to thereby improve an etching resistance of the resist pattern.

In the above plasma processing method, while the original plasma etching process is performed on the film, electrons are injected into the resist pattern used as an etching mask on the substrate by using the same plasma in the same processing chamber. Due to the modification effect of the resist pattern, the etching resistance thereof increases, and the etching selectivity against the mask is improved.

In accordance with still another aspect of the invention there is provided a computer readable storage medium storing therein a control program operating on a computer, wherein the control program, when executed, controls a plasma processing apparatus to perform the plasma processing method described above.

In accordance with the plasma processing method and the computer readable storage medium of the present embodiment, due to the aforementioned configurations and operations, it is possible to improve and stabilize the accuracy of thin film processing by increasing an etching resistance of a resist pattern by using a capacitively coupled plasma processing apparatus and a simple and effective resist modification technique.

BRIEF DESCRIPTION OF THE DRAWINGS

The other objects and features of the present invention will become apparent from the following description of embodiments, given in conjunction with the accompanying drawings, in which:

FIG. 3 provides a cross sectional view for schematically explaining a resist modification process, in which electrons are injected into a resist pattern on a semiconductor wafer;

FIG. 5 offers SEM pictures illustrating a modification effect obtained in a test of the resist modification process in the first embodiment;

FIG. 7B describes a modification effect obtained in a test of the resist modification process in the first embodiment by using the FTIR;

DETAILED DESCRIPTION OF THE EMBODIMENT

The embodiments of the present invention will be described with reference to the accompanying drawings which form a part hereof.

Figure 1:
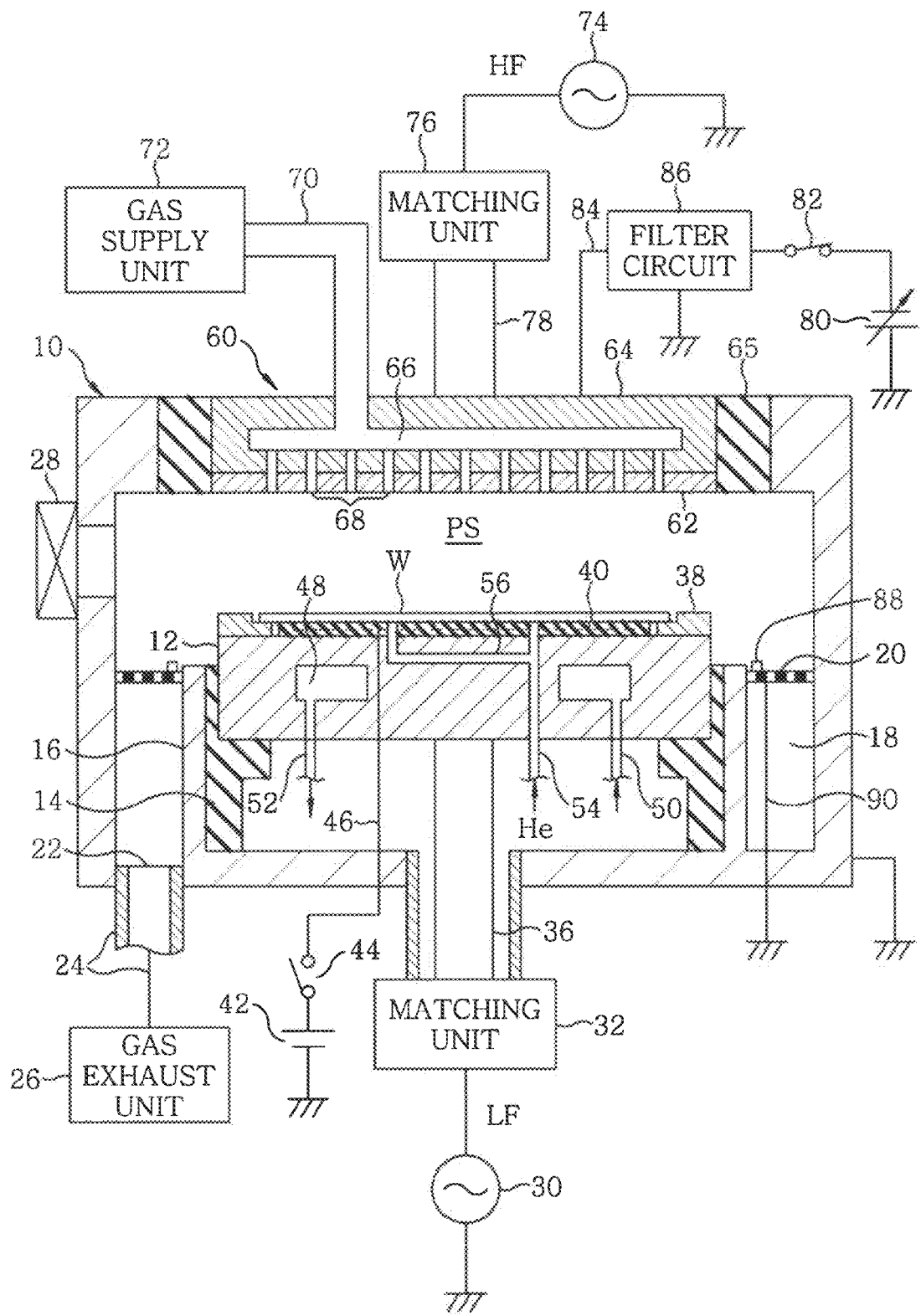
FIG. 1 is a cross sectional view showing a configuration of a plasma processing apparatus used in a plasma processing method in accordance with a first embodiment of the present invention.

FIG. 1 shows a configuration of a plasma processing apparatus used in a plasma processing method of the present invention. This plasma processing apparatus is configured as a capacitively coupled plasma etching apparatus, and has a cylindrical chamber (processing vessel) 10 made of metal, e.g., aluminum, stainless steel or the like. The chamber 10 is frame grounded.

A circular plate-shaped susceptor 12 for mounting thereon a substrate to be processed, e.g., a semiconductor wafer W, is horizontally disposed inside the chamber 10 and serves as a lower electrode. The susceptor 12 is made of, e.g., aluminum, and is supported by an insulating cylindrical support portion 14 extending vertically upward from a bottom portion of the chamber 10. An annular gas exhaust passageway 18 is formed between a conductive cylindrical supporting portion (inner wall portion) 16 extending upward from the bottom portion of the chamber 10 along an outer periphery of the cylindrical support portion 14 and a sidewall of the chamber 10. A ring-shaped gas exhaust ring (baffle plate) 20 is attached to an entrance of the gas exhaust passageway 18. A gas exhaust port 22 is disposed on the bottom portion of the gas exhaust passageway 18, and is connected to a gas exhaust unit 26 via a gas exhaust line 24. The gas exhaust unit 26 has a vacuum pump such as a turbo molecular pump or the like, so that a processing space inside the chamber 10 can be depressurized to a desired vacuum level. Attached to a sidewall of the chamber 10 is a gate valve 28 for opening and closing a loading/unloading port for the semiconductor wafer W. A radio frequency power supply 30 is electrically connected to the susceptor 12 via a matching unit 32 and a power feed rod 36. Here, the radio frequency power supply 30 outputs a radio frequency power LF of a frequency (generally lower than or equal to about 13.56 MHz) which contributes to ion attraction to the semiconductor wafer W on the susceptor 12. The matching unit 32 is configured to perform matching between an impedance of the radio frequency power supply 30 side and an impedance of a load (mainly, electrode, plasma and chamber) side and control a matching point automatically.

The susceptor 12 has a larger diameter than that of a semiconductor wafer W to be processed, which is mounted above the susceptor 12, and a focus ring (correction ring) 38 is disposed to surround the semiconductor wafer W.

An electrostatic chuck 40 for adsorbing a wafer is disposed on a top surface of the susceptor 12. The electrostatic chuck 40 has a structure in which a sheet-shaped or a mesh-shaped DC electrode is embedded in a film-shaped or a plate-shaped dielectric material. A DC power supply 42 provided outside the chamber 10 is electrically connected to the DC electrode via a switch 44 and a high voltage feeder line 46. The semiconductor wafer W can be adsorptively held on the electrostatic chuck 40 by Coulomb force generated by a DC voltage applied from the DC power supply 42 to the DC electrode.

An annular coolant path 48 extending, e.g., in a circumferential direction, is provided inside the susceptor 12. A coolant, e.g., cooling water of a specific temperature, flows in the coolant path 48 from a chiller unit (not shown) via a line 50, and flows out via a line 52. Accordingly, the temperature of the semiconductor wafer W on the electrostatic chuck 40 can be controlled by adjusting the specific temperature of the coolant. Further, in order to thermally couple the semiconductor wafer W to the susceptor 12, a heat transfer gas, e.g., He gas, is supplied to a contact interface between the electrostatic chuck 40 and the semiconductor wafer W from a heat transfer gas supply unit (not shown) via a gas supply line 54 and a gas passageway 56 inside the susceptor 12.

An upper electrode 60 facing the susceptor 12 in parallel is provided at a ceiling portion of the chamber 10, the upper electrode 60 serving as a shower head. The upper electrode 60 includes an electrode plate 62 facing the susceptor 12; and an electrode supporting member 64 for supporting the electrode plate 62 in an attachable and detachable manner from the rear (top) surface thereof. The electrode supporting member 64 has therein a gas diffusion space 66, and a plurality of gas discharge openings 68 extending from the gas diffusion space 66 toward the susceptor 12 are formed in the electrode supporting member 64 and the electrode plate 62. A space between the electrode plate 62 and the susceptor 12 serves as a plasma generation space PS or a processing space PS. The gas diffusion space 66 is connected to a gas supply unit 72 via a gas supply line 70.

A material of the electrode plate 62 of the upper electrode 60 exposed to a plasma during the processing plays an important role in the upper electrode 60. In this embodiment, the electrode plate 62 serves as a DC voltage application member, so that it is preferable to use a material capable of maintaining DC conductivity on a surface thereof and preventing an adverse effect on the process in spite of sputtering due to the incidence of ions from the plasma. For example, the electrode plate 62 is preferably made of C (carbon) or a Si-containing conductive material such as Si, SiC or the like. The electrode supporting member 64 may be made of, e.g., alumite-treated aluminum. A ring-shaped insulator 65 is inserted between the upper electrode 60 and the chamber 10, so that the upper electrode 60 is attached to the chamber 10 in a state electrically isolated therefrom.

A radio frequency power supply 74 is electrically connected to the upper electrode 60 via a matching unit 76 and an upper power feed rod 78. The radio frequency power supply 74 outputs a radio frequency power HF of a frequency (generally greater than or equal to about 40 MHz) that contributes to plasma generation. The matching unit 76 is configured to perform matching between an impedance of the radio frequency power supply 74 side and an impedance of a load (mainly, electrode, plasma and chamber) side and control a matching point automatically.

An output terminal of a variable DC power supply 80 installed outside the chamber 10 is electrically connected to the upper electrode 60 via a switch 82 and a DC power supply line 84. The variable DC power supply 80 is configured to output a variable DC voltage $V_{DC}$ ranging between, e.g., about −2000 V and +1000 V.

A filter circuit 86 provided in the middle of the DC power supply line 84 is configured to allow a DC voltage $V_{DC}$ from the variable DC power supply 80 to pass therethrough and to be applied to the upper electrode 60. The filter circuit 86 is also configured to allow a radio frequency power supplied from the susceptor 12 to the DC power supply line 85 via the processing space PS and the upper electrode 60 to flow toward the ground line without allowing it to flow toward the variable DC power supply 80.

Further, a ring-shaped DC ground member (DC ground electrode) 88 made of a conductive material, e.g., Si, SiC or the like, is attached to a portion facing the processing space PS in the chamber 10, e.g., a top surface of the baffle plate 20, the vicinity of a top portion of the conductive supporting member 16 or a radially outer portion of the upper electrode 60. This ring-shaped DC ground member 88 is constantly grounded via a ground line 90.

The control unit 110 (see FIG. 19) includes a microcomputer, and controls an entire operation (sequence) of the apparatus and independently controls an operation of each unit in the apparatus, especially the gas exhaust unit 26, the radio frequency power supplies 30 and 74, the switches 44 and 82, the processing gas supply unit 72, the variable DC power supply 80, the chiller unit (not shown), a heat transfer gas supply unit (not shown) and the like. In this plasma etching apparatus, in order to perform etching on the semiconductor wafer W on the susceptor 12, a processing gas containing an etchant gas is introduced from the processing gas supply unit 72 into the chamber 10 at a predetermined flow rate, and a pressure inside the chamber 10 is set to a predetermined level by using the gas exhaust unit 26. Moreover, the first radio frequency power HF (greater than or equal to about 40 MHz) for plasma generation is applied from the radio frequency power supply 74 to the upper electrode 60 via the matching unit 76 and the upper power feed rod 78, and the second radio frequency power LF (smaller than or equal to about 13.56 MHz) for ion attraction is applied from the radio frequency power supply 30 to the susceptor 12 via the matching unit 32 and the lower power feed rod 36. Furthermore, by turning on the switch 44, an electrostatic force attracts the semiconductor wafer W to the electrostatic chuck 40, thereby confining a heat transfer gas (He gas) in the contact interface between the electrostatic chuck 40 and the semiconductor wafer W. The processing gas discharged from the shower head 60 is converted into a plasma between both electrodes 12 and 60 by a high frequency discharge, and a film to be processed on the surface of the semiconductor wafer W is etched in a desired pattern by radicals or ions generated from the plasma.

In this plasma processing apparatus, by applying to the upper electrode 60 the comparatively high first radio frequency power HF higher than or equal to about 40 MHz (preferably greater than or equal to about 60 MHz) that is suitable for plasma generation, it is possible to form a plasma of high density in a desired dissociation state and, hence, a high-density plasma can be obtained even under a lower pressure condition. Further, by applying to the susceptor 12 the comparatively low second radio frequency power LF lower than or equal to about 13.56 MHz that is suitable for ion attraction, with high selectivity highly anisotropic etching can be performed on the film to be processed on the semiconductor wafer W. Although the first radio frequency power for plasma generation is required to be used in any plasma process, the second radio frequency power for ion attraction may not be used depending on the processes.

Moreover, by applying a DC voltage (between about −900 V and 0 V) from the variable DC power supply 80 to the upper electrode 60 during the plasma etching process, it is possible to improve plasma ignition stability, etching selectivity against resist, etching rate, etching uniformity and the like.

In the above-described plasma etching process, as for an etching mask used for patterning a film to be processed on the surface of the semiconductor wafer W, there is used a resist pattern formed in advance on the corresponding film by a photolithography process. Here, when an ArF excimer laser beam (wavelength 193 nm) is used as an exposure beam to achieve high resolution in lithography, a highly sensitive chemically amplified resist (ArF resist) is used.

First Embodiment

Hereinafter, a plasma processing method in accordance with a first embodiment of the present invention will be explained. In the present embodiment, a resist modification process and a trimming process are sequentially performed as preprocesses to a resist pattern before a plasma etching process is performed on a film to be processed on an object to be processed, e.g., a semiconductor wafer W loaded into the chamber 10.

Figure 2C:
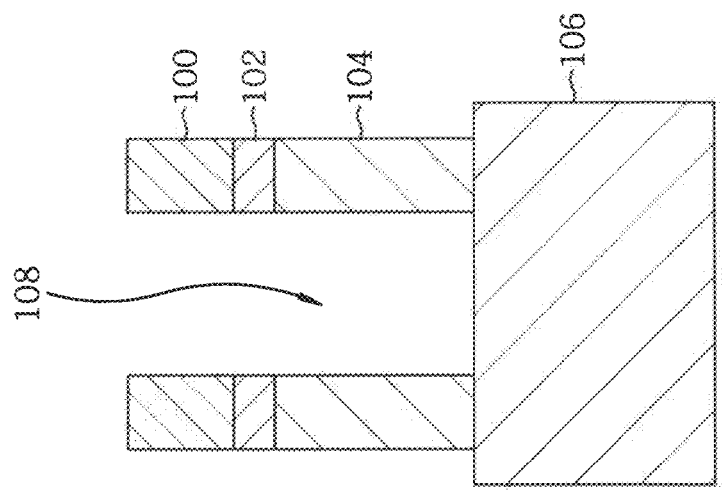
FIG. 2A to 2C schematically illustrates a sequence of a trimming process.
Figure 2B:
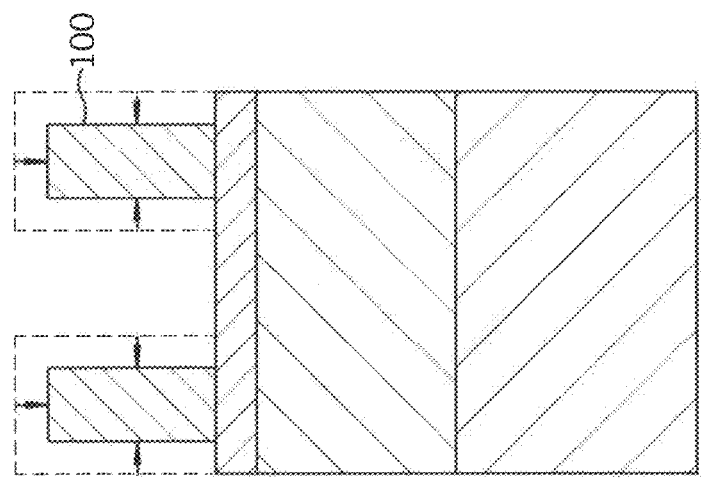
Figure 2A:
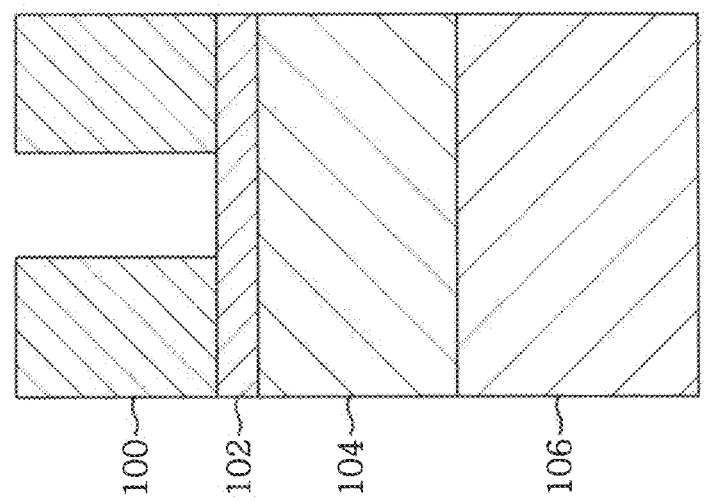

FIG. 2A to 2C explains an example of a trimming process in a multi-layer resist method. In FIG. 2A to 2C, an uppermost layer (first layer) film 100 is a resist pattern of an ArF resist; a second layer film 102 is BARC (bottom anti-reflection coating: first etching target film); a third layer film 104 is an SiN layer (second etching target film) as a final mask; and a base film 106 is an original (final) film to be processed, e.g., a $SiO_2$ layer (third etching target film). A CVD (chemical vapor deposition) method or a spin-on coating method is used for forming the SiN film 104 and the BARC 102, and a photolithography is used for patterning the photo resist 100.

The trimming process is performed to form a thin pattern of a desired size as shown in FIG. 2B by removing surface portions of the resist pattern 100 of FIG. 2A in directions in parallel with pattern surfaces, the resist pattern 100 being formed by a photolithography process. When the BARC 102 and the SiN film 104 are sequentially etched by using the thin resist pattern 100 as a mask, a thin pattern same as the resist pattern 100 can be formed or transferred on the SiN film 104, as can be seen from FIG. 2C. Although further processes are not described, the base film ($SiO_2$ film) 106 is etched by using as a mask the SiN pattern 104 after ashing which removes a residual film of the BARC 102 and the resist pattern 100.

When a resist pattern needs to be formed in a desired thin size at once during the resist process, the resist pattern may collapse during the photolithography process (especially during the development). To that end, there is employed a method for reducing the resist pattern to a desired thin size by performing a trimming process after the photolithography process. This trimming process can be carried out by using a plasma etching apparatus used for etching an original film to be processed.

Conventionally, the ArF resist has a poor etching resistance (plasma resistance). Therefore, if the plasma etching for trimming is carried out, the resist pattern 100 is easily overetched, and a shape change such as shoulder-shape deformation or the like occurs in the resist pattern 100, which results in poor trimming accuracy.

To that end, in the present embodiment, a resist modification process for increasing the etching resistance of the resist pattern 100 is performed before the trimming process in the same plasma processing apparatus (FIG. 1). This resist modification process is performed by a plasma processing, in which high-energy electrons e– are injected into the resist pattern 100 and the ArF resist resin is modified from a top portion to an inner deep portion, as can be seen from FIG. 3.

In other words, a predetermined processing gas is introduced from the processing gas supply unit 72 into the chamber 10 at a proper flow rate, and a pressure in the chamber 10 is adjusted to a preset level by the gas exhaust unit 26. Further, the first radio frequency power HF (greater than or equal to about 40 MHz) for plasma generation is applied from the radio frequency power supply 74 to the upper electrode 60 via the matching unit 76 and the upper power feed rod 78. Furthermore, if necessary, the second radio frequency power LF (lower than or equal to about 13.56 MHz) for ion attraction is applied from the radio frequency power supply 30 to the susceptor 12 via the matching unit 32 and the lower power feed rod 36. Moreover, by turning on the switch 44, the heat transfer gas (He gas) is confined in the contact interface between the electrostatic chuck 40 and the semiconductor wafer W by the electrostatic adsorptive force. The processing gas discharged from the shower head 60 is dissociated and ionized between both electrodes 12 and 60 by the high frequency discharge, thus generating a plasma PR.

Figure 4:
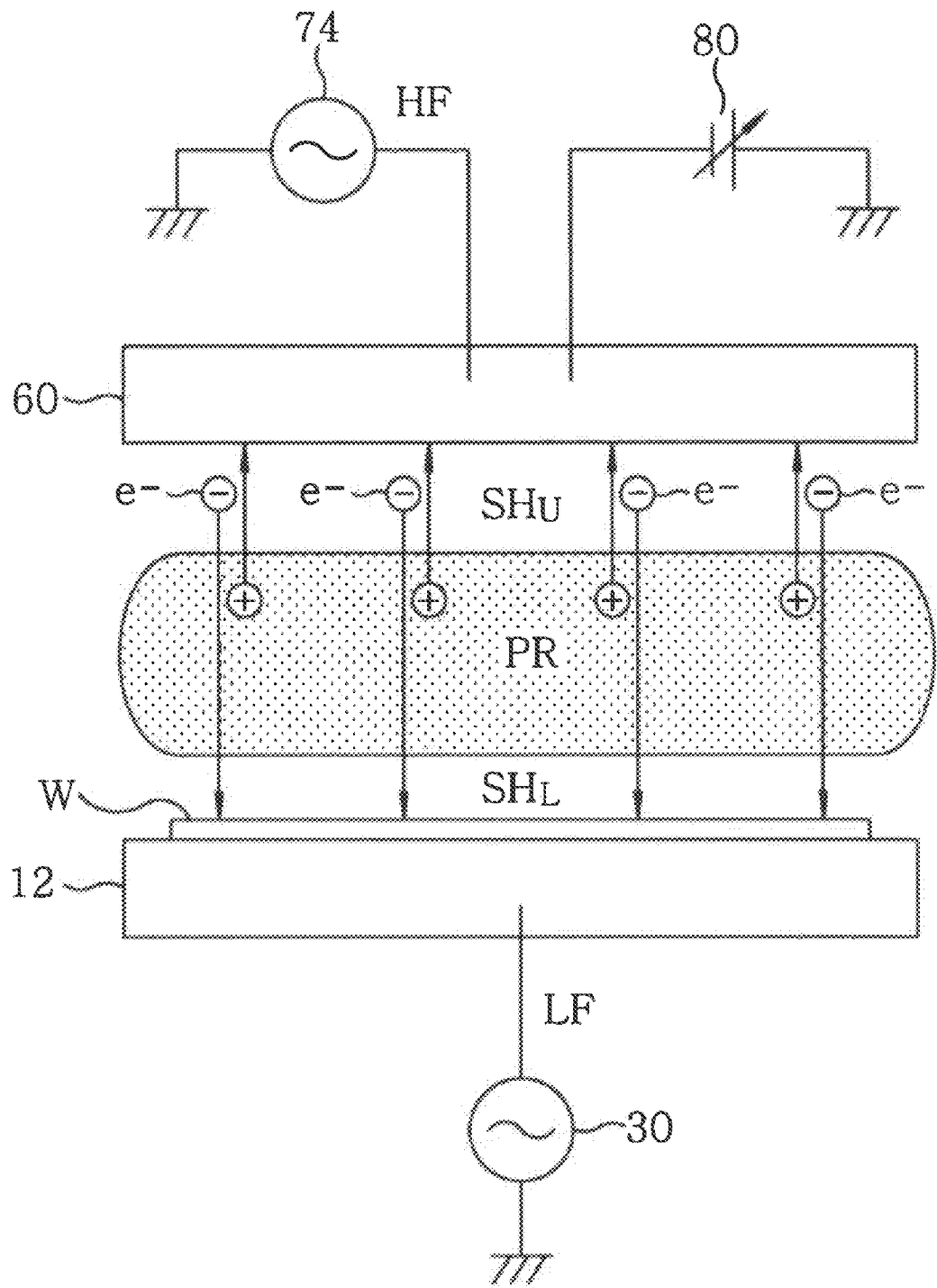
FIG. 4 is a view for schematically explaining a principle of a resist modification process, in which ions are injected into the resist pattern on the semiconductor wafer.

Here, as shown in FIG. 4, if a negative voltage $V_{DC}$ (preferably having an absolute value greater than or equal to about 1000 V, and more preferably having an absolute value greater than or equal to about 1500 V, as will be described later) is applied to the upper electrode 60, an upper ion sheath $SH_U$ formed between the upper electrode 60 and a plasma PR becomes thick, and a sheath voltage $V_U$ becomes substantially the same as the DC voltage $V_{DC}$. Accordingly, ion impact energy generated when ions (+) in the plasma PR are accelerated by an electric field of the upper ion sheath $SH_U$ and collide with the upper electrode 60 (electrode plate 62) increases so that the number of secondary electrons e– discharged from the electrode plate 62 (γ discharge) increases. Further, the secondary electrons e– discharged from the electrode plate 62 are accelerated by the electric field of the upper ion sheath $SH_U$ in a reverse direction to that of the ions, and pass through the plasma PR. Next, the secondary electrons e– traverse a lower ion sheath $SH_L$, and then are injected with a predetermined high energy into the resist pattern 100 formed on the surface of the semiconductor wafer W on the susceptor 12. At this time, the secondary electrons e– pass through the plasma PR having no electric field at a constant speed, and then are decelerated in the lower ion sheath $SH_L$ by a reverse direction electric field, thereby losing a part of the electron energy. For that reason, a self-bias $V_{DC}$ or a sheath voltage $V_L$ of the lower ion sheath $SH_L$ formed on the susceptor 12 is preferably set as small as possible, and is generally lower than or equal to about 100 V. Therefore, the power of the second radio frequency power LF (lower than or equal to 13.56 MHz) applied to the susceptor 12 is preferably lower than or equal to about 50 W, and more preferably 0 W.

In accordance with the resist modification method of the present embodiment, referring to FIG. 4, as an absolute value of the negative DC voltage $V_{DC}$ applied to the upper electrode 60 increases, an energy of an electron injected into the resist pattern on the semiconductor wafer W increases and, also, an electron penetration depth, i.e., a modification depth, in the resist pattern increases.

FIG. 5 provides SEM pictures showing a modification effect obtained in a test of a resist modification process in the present embodiment. Main processing conditions are described as follows.

Resist: acrylate based ArF resist
Resist film thickness before processing: 261 nm
Processing gas: $CF_4$=100 sccm
Pressure in chamber: 100 mTorr
Radio frequency power: 60/13 MHz=1000/30 W
DC voltage $V_{DC}$: 0 V, –500 V, –1000 V, –1500 V (four types)
Processing time: 60 seconds As illustrated in FIG. 5, respective thicknesses of the modified layers obtained by the resist modification processes were 0 nm at $V_{DC}$ of 0 V, about 22 nm at $V_{DC}$ of –500 V, about 83 nm at $V_{DC}$ of –1000 V, and about 173 nm at $V_{DC}$ of –1500 V. Moreover, respective depths measured from the resist surface at an initial state (before the processing) were 0 nm at $V_{DC}$ of 0 V, about 19 nm at $V_{DC}$ of –500 V, about 62 nm at $V_{DC}$ of –1000 V, and about 120 nm at $V_{DC}$ of –1500 V.

The reason why the thickness of the resist film (especially, the modified layer) increased by the resist modification process as shown in FIG. 5 was because polymer of the resist absorbed energy of the electrons, which in turn caused structure change, composition change, cross-linking reaction or the like. Besides, the reason why a fluorocarbon gas ($CF_4$) was used as a processing gas was because it was important to maintain a surface of the electrode plate 62 of the upper electrode 60 in a clean state by removing polymer that was easily deposited on the electrode plate 62 by the etching operation of fluorine. In the case when the secondary electron discharge and the ion irradiation in the upper electrode 60 are the only ones to be concerned, it is also possible to use $O_2$ gas, $N_2$ gas, or a rare gas such as Ar or the like.

Figure 6:
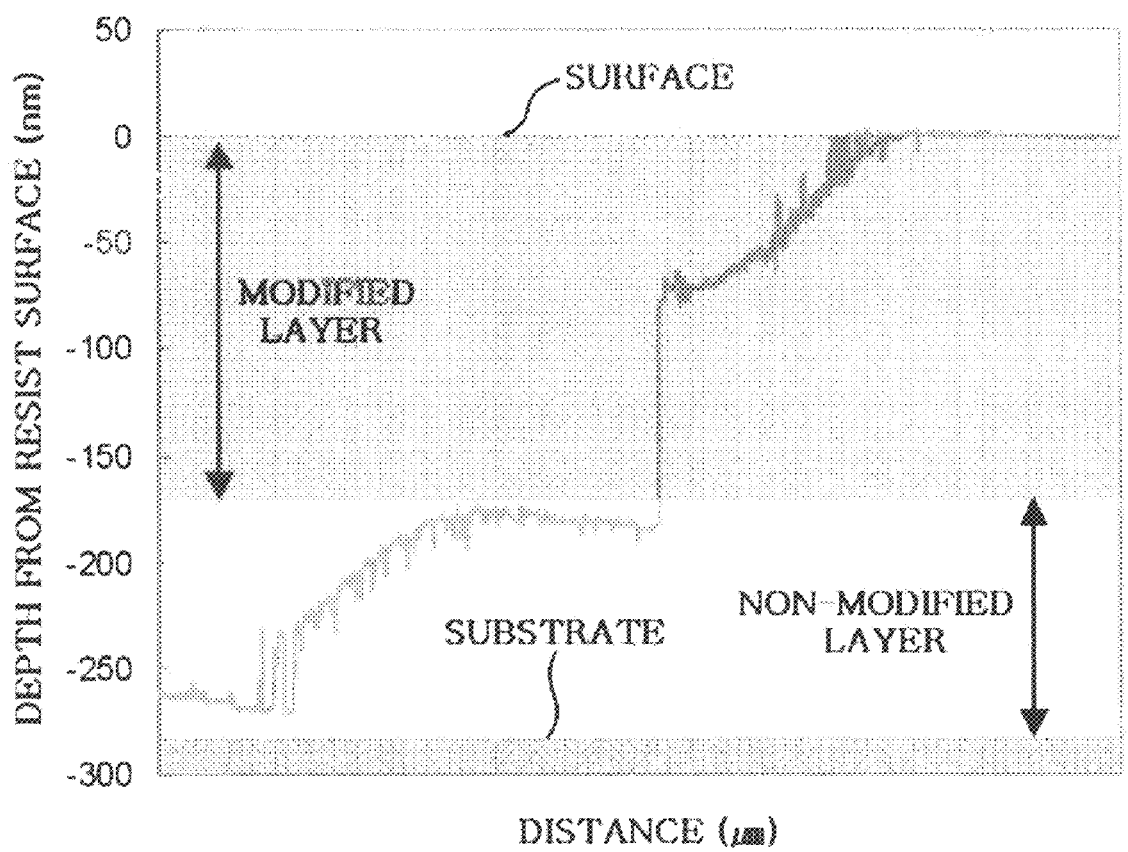
FIG. 6 shows a modification effect obtained in a test of the resist modification process in the first embodiment by cutting and measuring a stepped portion

FIG. 6 shows a result of measuring a stepped portion by cutting the resist pattern after performing the resist modification process at $V_{DC}$ of about −1500 V. At this time, a stepped portion (interface) was seen at a depth of about 173 nm as same as in the SEM picture of FIG. 5.

Figure 7A:
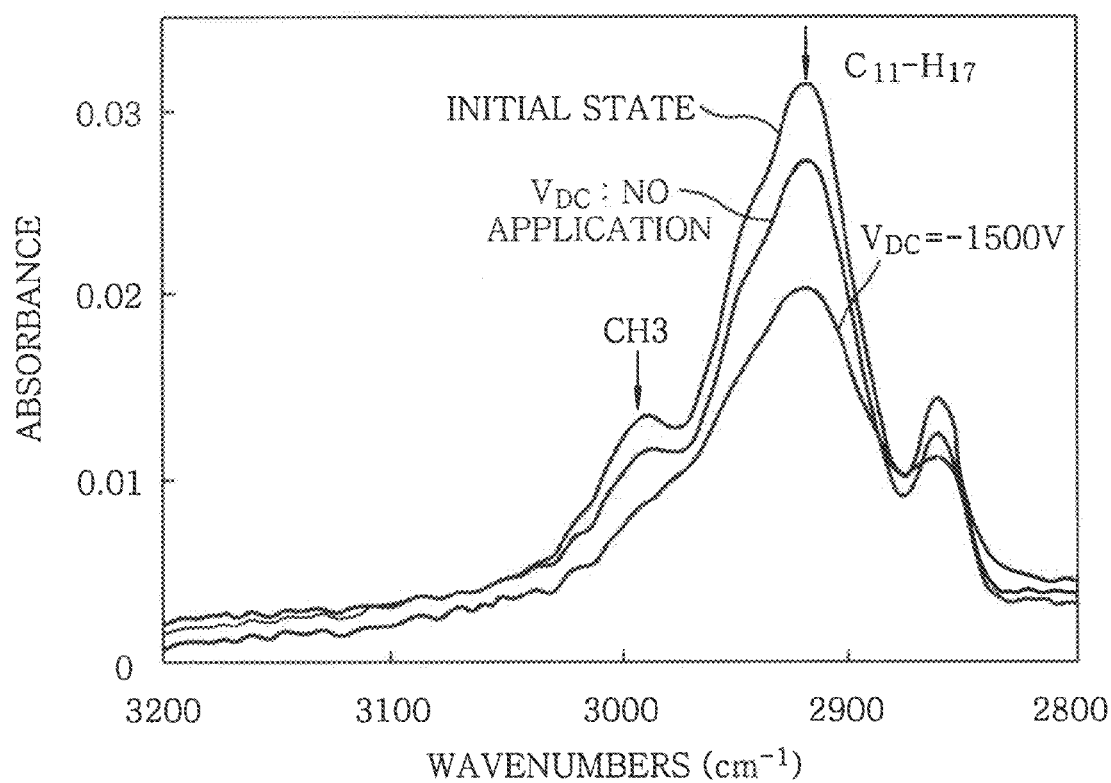
FIG. 7A depicts a modification effect obtained in a test of the resist modification process in the first embodiment by using a Fourier transform infrared spectroscopy (FTIR)

FIGS. 7A and 7B show results of examining an infrared absorption spectrum before and after a resist modification process by using Fourier transform infrared spectroscopy (FTIR). Here, it is seen that the amount of adamantyl group ($C_{11}$—$H_{17}$), lactone group ($C_4H_5O_2$) or the like greatly decreased by the resist modification process (as the modification effect increases). Therefore, it is proved that chemical reactions were in progress.

Figure 8:
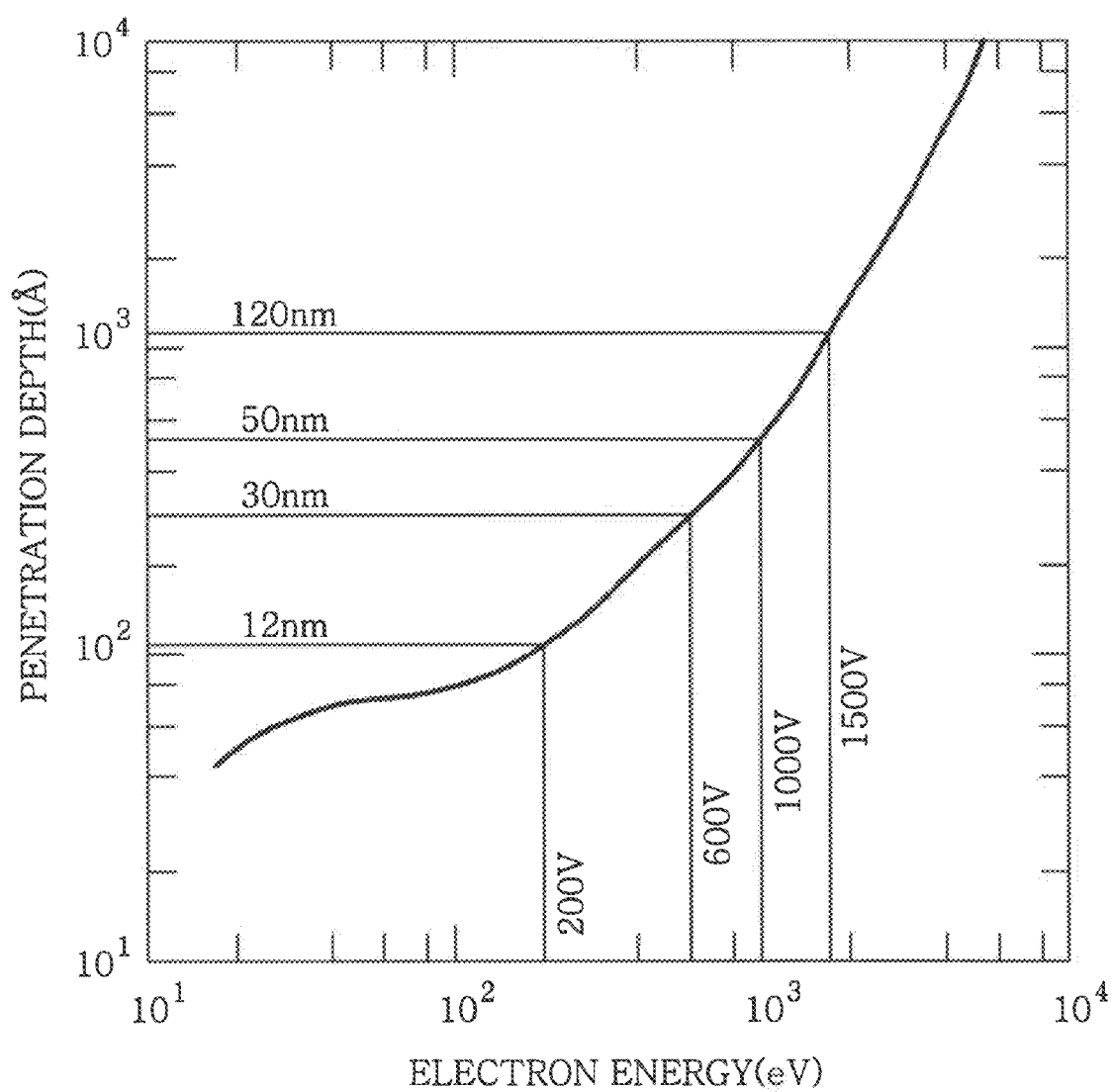
FIG. 8 is a graph showing a theoretical relationship between an electron energy and an electron penetration depth in the case of injecting electrons into the resist.

Generally, it is theoretically known that the electron energy, when electrons are injected into the resist, is generally proportional to an electron penetration depth, as shown in a function (graph) of FIG. 8. According to this theory, the penetration depth is about 30 nm at the electron energy of 600 eV; about 50 nm at the electron energy of 1000 eV; and about 120 nm at the electron energy of 1500 eV.

Figure 9:
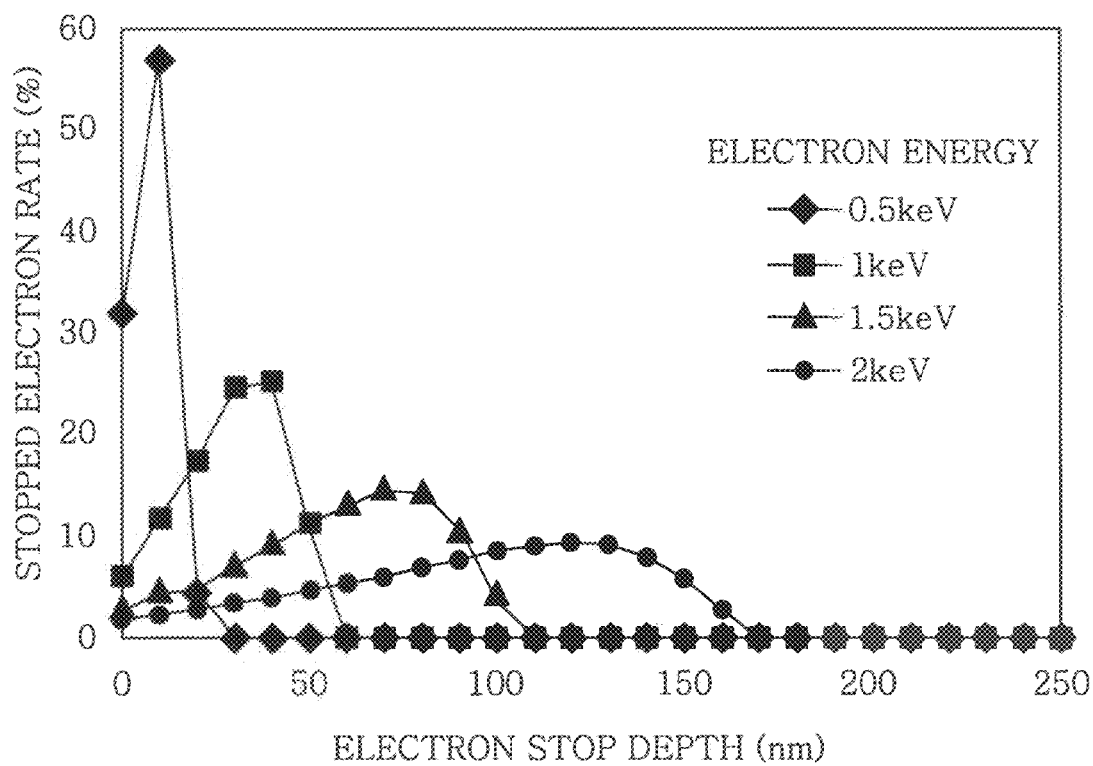
FIG. 9 is a graph illustrating a simulation result showing a relationship between an electron stop depth and a percentage of stopped electrons in the case of injecting electrons into the resist pattern.

In addition, FIG. 9 presents a graph describing a relationship between an electron stop depth and a rate of stopped electrons in the case of injection electrons into the resist pattern (simulation). Referring to this graph, the penetration depth is at least about 30 nm (about 50 nm to the maximum) at the electron energy of 500 eV; at least about 60 nm (about 90 nm to the maximum) at the electron energy of 1000 eV; and at least about 110 nm (about 170 nm to the maximum) at the electron energy of 1500 eV.

Figure 10:
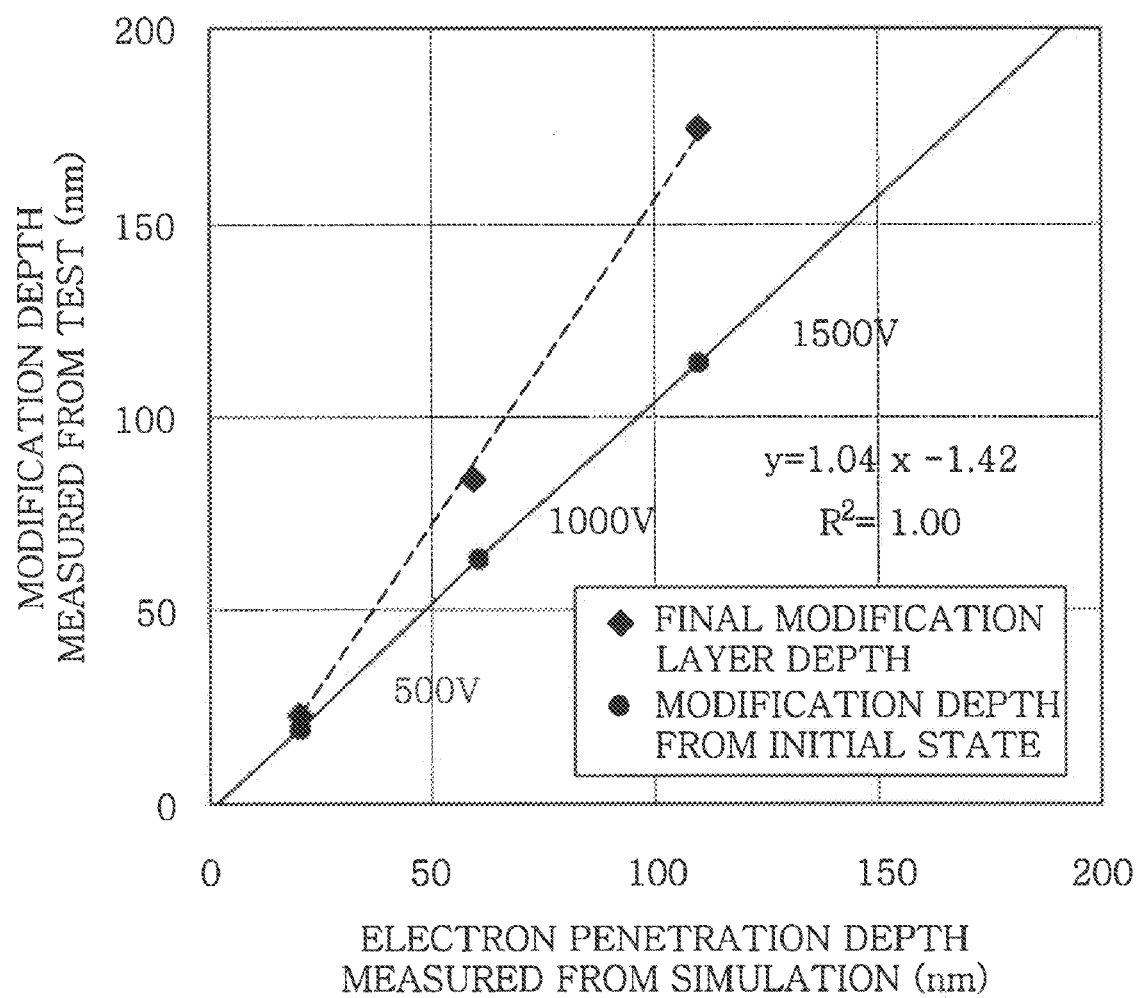
FIG. 10 illustrates a relation between the simulation and the test result.

FIG. 10 shows a relationship between the electron penetration depth (see FIG. 9) measured from the simulation and the modification depth (see FIG. 5) measured from the test. As illustrated, both generally correspond to each other.

As can be seen from the principle described in FIG. 4, in the resist modification process of the present embodiment, the energy of the electron injected into the resist pattern 100 formed on the surface of the semiconductor wafer W on the susceptor 12 is defined by a voltage difference between the sheath voltage $V_U$ of the upper ion sheath $SH_U$ and the sheath voltage $V_L$ of the lower sheath voltage $V_L$ ($V_U$−$V_L$). Here, the upper ion sheath $SH_U$ is substantially the same as the negative DC voltage $V_{DC}$ applied to the upper electrode 60, and the lower sheath voltage $V_L$ is substantially the same as the self-bias voltage $V_{dc}$ generated on the susceptor 12. Accordingly, when the self-bias voltage $V_{dc}$ on the susceptor 12 is, e.g., 100 V, an absolute value of the negative DC voltage $V_{DC}$ may set to be greater than or equal to about 1100 V in order to reliably obtain the modification depth greater than or equal to about 60 nm in the resist pattern. Further, absolute value of the negative DC voltage $V_{DC}$ may set to be greater than or equal to about 1600 V in order to reliably obtain the modification depth greater than or equal to about 110 nm.

When the second radio frequency power LF for ion attraction is not applied to the susceptor 12, the self-bias voltage $V_{dc}$ is negligibly small compared to the negative DC voltage $V_{DC}$. When the self-bias voltage $V_{dc}$ is considered as 0 V, e.g., when the modification depth needs to be greater than or equal to about 110 nm, an absolute value of the negative DC voltage $V_{DC}$ is preferably set to be greater than or equal to about 1500 V.

Figure 11:
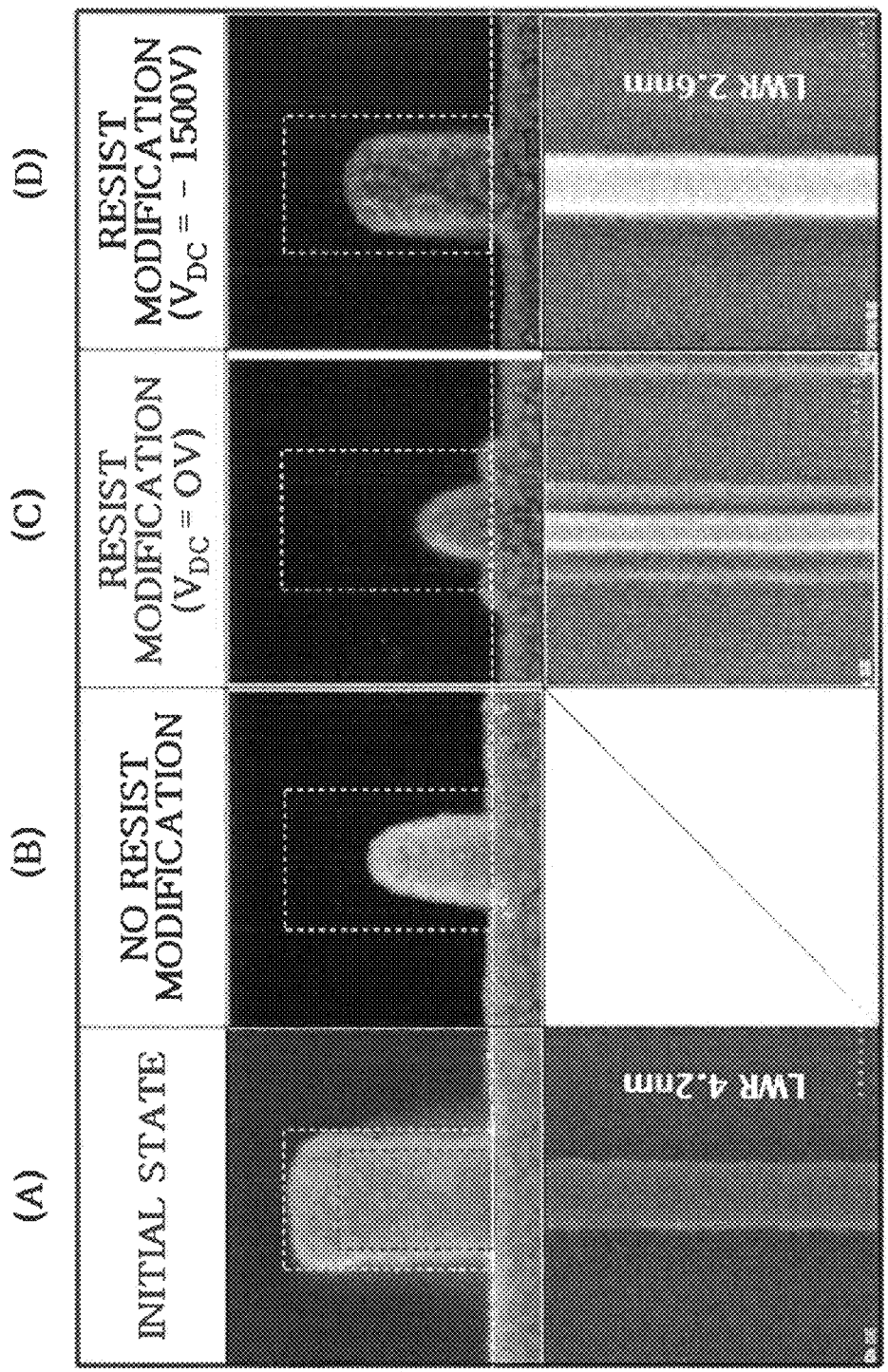
FIG. 11 is SEM pictures of a resist pattern cross sectional shapes obtained by performing a trimming process after the resist modification process in the first embodiment and those of a comparative example.

FIG. 11 presents SEM pictures showing a result (pattern cross sectional shapes) obtained by carrying out a trimming process after performing the resist modification process on the resist pattern on the semiconductor wafer W in the present embodiment together with a result of a comparative example. Main processing conditions in the trimming process are described as follows.

Processing gas: $N_2/O_2$=100/20 sccm
Pressure in chamber: 10 mTorr
Radio frequency power supply: 60/30 MHz=1000/0 W
Processing time: 17 seconds As illustrated in FIG. 11B, in the case where the trimming process was carried out without performing the resist modification process (comparative example), shoulder-shape deformation occurred in the resist pattern, and the resist pattern was over-etched compared to a desired size (outline indicated by an inner dotted line).

In the case where the trimming process was carried out under the above conditions after the resist modification process was performed at the DC voltage $V_{DC}$ of about −1500 V, the shape deformation of the resist pattern was small, and the trimming was performed at a size close to a desired level, as can be seen from FIG. 11D. Namely, the etching resistance or the plasma resistance of the resist pattern was sufficient so as not to cause shoulder-shape deformation thereof during the plasma etching for trimming.

As illustrated in FIG. 11C, in the case where the trimming process was performed under the above conditions after the resist modification process was carried out at the DC voltage $V_{DC}$ of 0 V (reference example), a poorer result was obtained compared to the case where the resist modification process was not performed. Namely, when the resist modification process was performed at the DC voltage $V_{DC}$ of 0 V, it was hardly possible to inject electrons into the resist pattern on the semiconductor wafer W, so that the modified layer was not formed. In addition, since a fluorocarbon gas ($CF_4$) was used as a processing gas, the resist pattern was etched isotropically by fluorine radicals. As a result, the pattern size was reduced.

In this embodiment, a test for etching the SiN film 104 was performed as shown in FIG. 2C. Main etching conditions are described as follows.

Figure 12A:
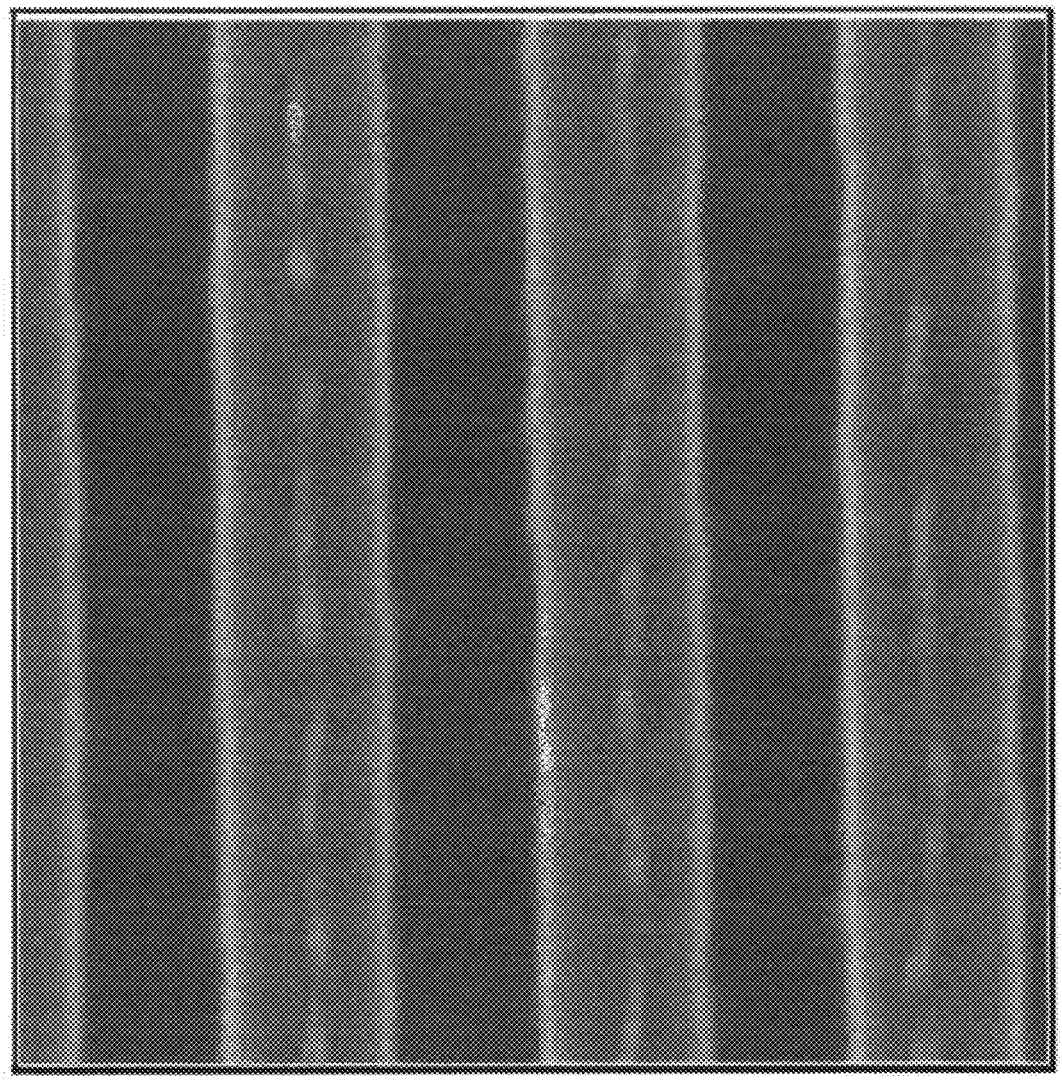
FIG. 12A offers an SEM picture of a resist pattern cross sectional shape obtained by etching an SiN film after the resist modification process in the first embodiment.

Processing gas: $CF_4/CHF_3/Ar/O_2$=225/125/600/60 sccm
Pressure in chamber: 75 mTorr
Temperature: upper electrode/chamber sidewall/lower electrode=60/60/30° C.
Radio frequency power: 40/13 MHz=100/1000 W
DC voltage $V_{DC}$: −300 v
Processing time: 30 seconds Referring to the test result, an SIN film pattern (SEM picture) shown in FIG. 12 was obtained after a residual resist pattern on the semiconductor wafer W was peeled off (removed) by ashing after completion of the SIN etching. An LWR of the SIN film pattern was about 7.7 at the maximum, while it was about 5.9 on the average.

Figure 12B:
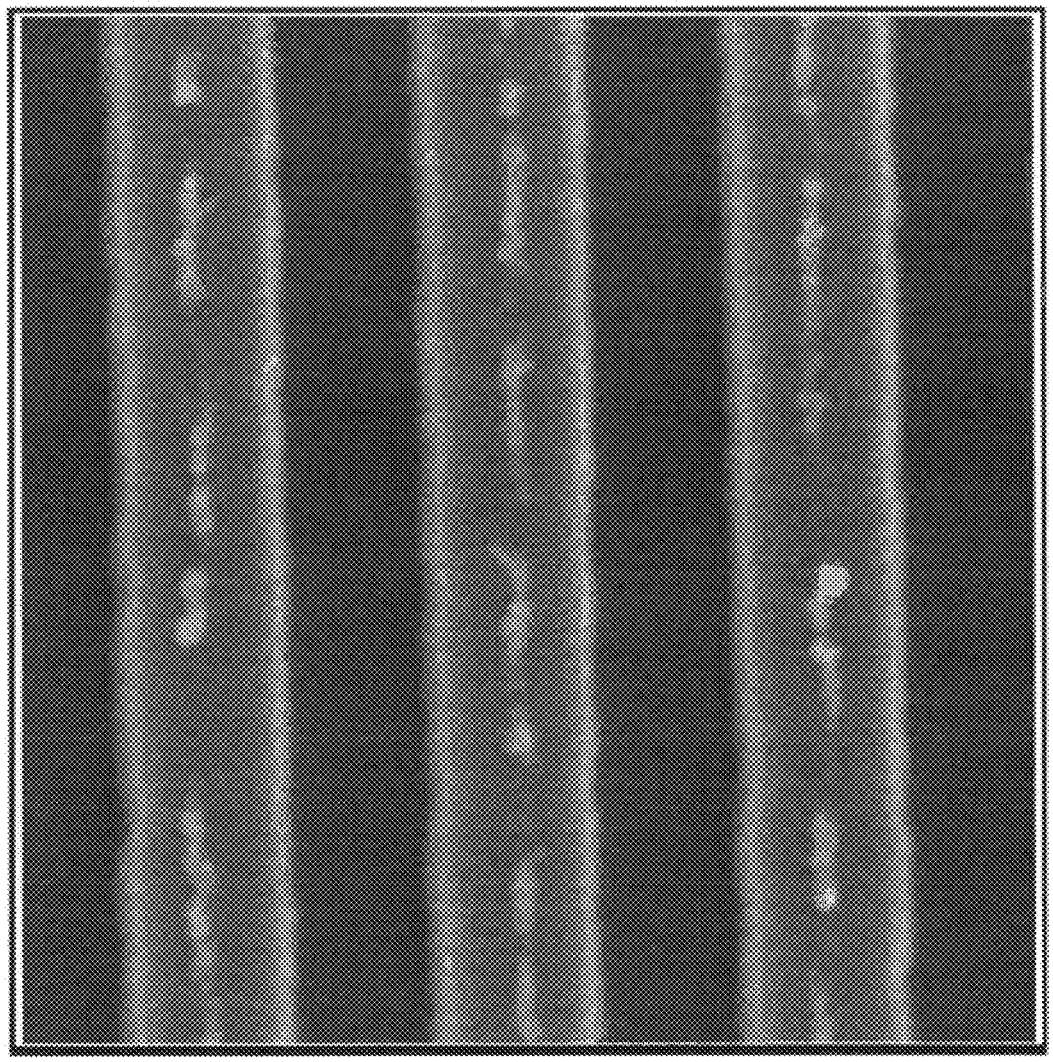
FIG. 12B sets forth an SEM picture of a resist pattern cross sectional shape obtained by etching an SiN film without performing the resist modification process in the first embodiment (comparative example)

FIG. 12B shows, as a comparative example, an SiN film pattern (top view) obtained by etching the SiN film without performing the resist modification process of the present embodiment. An LWR of the SiN film pattern was about 9.2 at the maximum, while it was about 6.9 on the average.

In accordance with the plasma processing method of the present embodiment, it is possible to effectively reduce the LWR of the SiN pattern used as a final mask in the multi-layer resist method.

The aforementioned first embodiment is advantageous in that optimum DC voltages $V_{DC}$ applied to the upper electrode 60 can be independently selected for a resist modification process and an original etching process.

The capacitively coupled plasma processing apparatus used in the plasma processing method of the present invention does not necessarily employ upper-and-lower plates dual frequency application type, as shown in FIG. 1, in which the first radio frequency power HF for plasma generation is applied to the upper electrode 60 and the second high frequency power LF for ion attraction is applied to the susceptor (lower electrode) 12, and may also employ, e.g., a lower side dual frequency application type in which the first radio frequency power HF and the second radio frequency power LF are applied to the susceptor (lower electrode) 12, a single frequency application type in which the first radio frequency power HF is applied to the upper electrode or the lower electrode, or the like.

Figure 13:
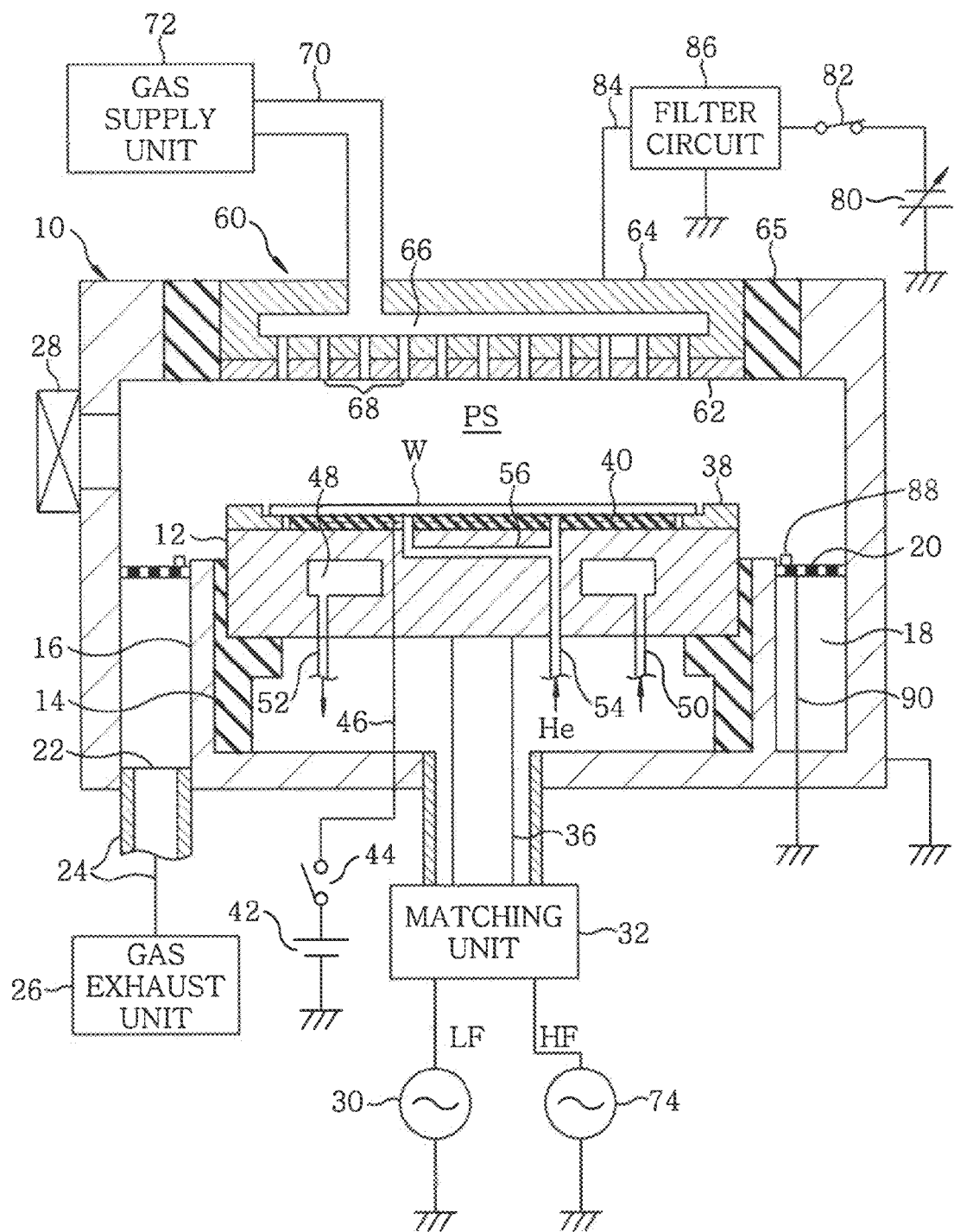
FIG. 13 presents a cross sectional view of another configuration of the plasma processing apparatus used in the plasma processing method of a second embodiment of the present invention.

FIG. 13 shows a configuration example of a capacitively coupled plasma processing apparatus employing a lower side dual frequency application type. In FIG. 13, like reference numerals will be used for like parts identical to those of the plasma processing apparatus of FIG. 1.

Second Embodiment

In a second embodiment of the present invention which will be described hereinafter, a resist modification process and a main etching process are performed simultaneously. In other words, the resist modification process is performed during the main etching process. Further, a mask selectivity is improved by enhancing an etching resistance of a resist pattern.

In a first test example of the present embodiment, the multi-layer resist method (FIG. 2A to 2C) was used, and a mask selectivity in a SiN etching was measured by performing a first process for etching the BARC 102 and modifying the resist pattern 12 and a second process for etching the SiN film 104. In this test, a plasma processing apparatus (FIG. 13) of a lower side dual frequency application type was used.

Main conditions for the first process (BARC etching/resist modification) are described as follows.

Resist: acrylate based ArF resist
BARC: organic film
Processing gas: $CF_4/O_2$=250/13 sccm
Pressure in chamber: 30 mTorr
Temperature: upper electrode/chamber sidewall/lower electrode=60/60/30° C.
Radio frequency power: 40/13 MHz=400/0 W
DC voltage $V_{DC}$: 0 V, −500 V, −1000 V, −1500 V, −1800 V (five types)
Processing time: 20 seconds Main conditions for the second process (SiN etching) are described as follows.

Figure 14:
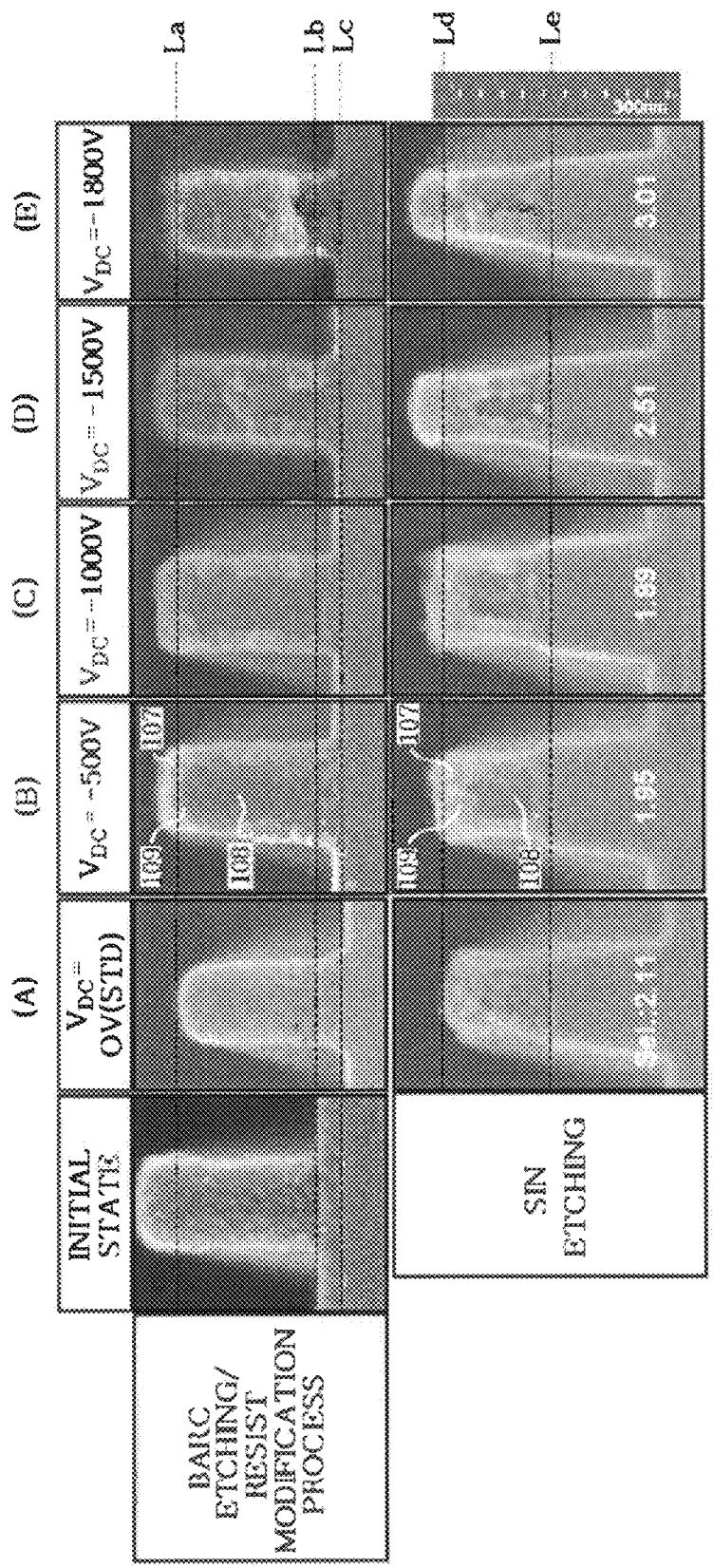
FIG. 14 represents an SEM picture of a resist pattern cross sectional shapes obtained after completion of each process in a test of the second embodiment.

Processing gas: $CF_4/CHF_3/Ar/O_2$=225/125/600/60 sccm
Pressure in chamber: 75 mTorr
Temperature: upper electrode/chamber sidewall/lower electrode=60/60/30° C.
Radio frequency power: 40/13 MHz=100/1000 W
DC voltage $V_{DC}$: −300 V
Processing time: 30 seconds FIG. 14 provides SEM pictures showing cross sectional shapes of a pattern obtained from the above test. In the above test, the DC voltage $V_{DC}$ applied to the upper electrode 60 in the first process (BARC etching/resist modification) was used as a parameter, and the case A where the $V_{DC}$ is 0 V was defined as reference (standard: STD). In FIG. 14, dotted lines $L_a$ and $L_c$ indicate a level of a top portion of the resist pattern 100 and a level of a top surface of the base layer (SiN film) 104 which were measured after completion of the first process in the reference (STD), respectively. A dotted line $L_b$ represents a level of a top surface of the BARC 102 which was measured before the first process. Moreover, dotted lines $L_d$ and $L_e$ indicate a level of a top portion of the resist pattern 100 and a level of an interface between the BARC 102 and the SiN film 104 which were measured after completion of the second process in the reference (STD), respectively.

Respective selectivities in the second process (SiN etching) were about 2.11 at $V_{DC}$ of 0 V; about 1.95 at $V_{DC}$ of −500 V; about 1.89 at $V_{DC}$ of −1000 V; about 2.51 at $V_{DC}$ of −1500 V; and about 3.01 at $V_{DC}$ of −1800 V. In other words, the mask selectivity improved remarkably when an absolute value of $V_{DC}$ was greater than or equal to 1500 V (when electron energy was greater than or equal to 1500 eV). Further, it has been confirmed that as an absolute value of $V_{DC}$ increases, the mask selectivity is improved.

Referring to FIG. 14, when $V_{DC}$ ranges from −500 V to −1800 V, the resist modified layer 107 was formed from the top surface of the resist pattern 100 toward the inside; the interface 109 between the modified layer 107 and the non-modified layer 108 was seen in the cross sectional shapes of the patterns (SEM pictures); and a thickness of the modified layer 107 (especially, a thickness in a vertical direction) increased as an absolute value of $V_{DC}$ increased.

Figure 15:
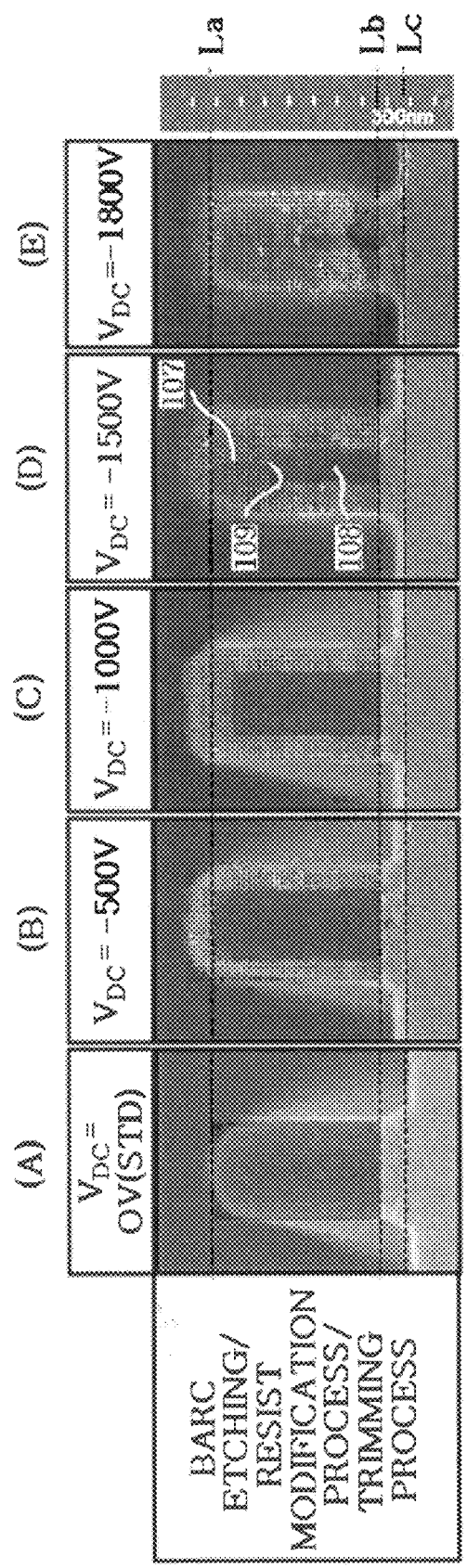
FIG. 15 shows binarized images, for clearer view, of a modified layer and a non-modified layer in the resist pattern cross sectional shapes (SEM picture) of FIG. 14.

FIG. 15 clearly shows the modified layer 107 and the non-modified layer 108 in the resist pattern 12 which were obtained by the image processing (binarization).

Figure 16:
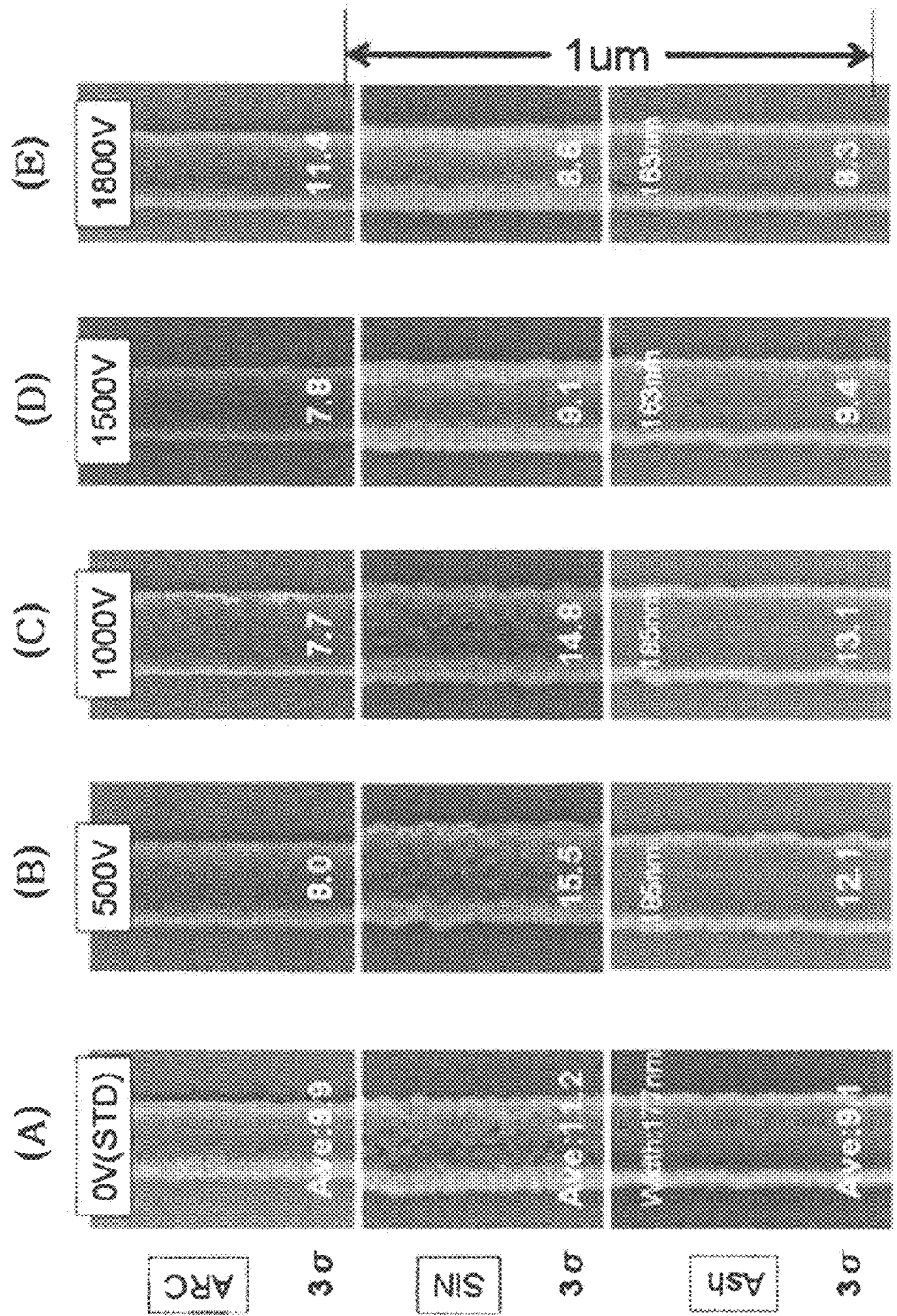
FIG. 16 is SEM pictures of plane shapes of patterns in each step in the second embodiment.

FIG. 16 presents SEM pictures showing a resist pattern [ARC] obtained after completion of the first process, a resist pattern [SiN] obtained after completion of the second process, and an SiN pattern [Ash] obtained after completion of the ashing. As illustrated, when an absolute value of $V_{DC}$ became greater than or equal to about 1500 at any stage, it was possible to see a remarkable reduction of uneven deformation of the pattern sidewall.

The LWRs (average at 36 normal distribution) of the SiN pattern [Ash] used as a final mask were about 9.1 at $V_{DC}$ of 0 V; about 12.1 at $V_{DC}$ of −500 V; about 13.1 at $V_{DC}$ Of −1000 V; about 9.4 at $V_{DC}$ of −1500 V; and about 8.3 at $V_{DC}$ of −1800 V.

Third Embodiment

In a third embodiment of the present invention, a resist modification process and a trimming process are performed simultaneously together with a main etching process. In other words, the trimming process as well as the resist modification process is performed together during the main etching process, thus reducing the number of processes and improving processing efficiency.

In a first test example of the present embodiment, the multi-layer resist method (FIG. 2A to 2C) was implemented by performing a first process for etching the BARC 102 and modifying the resist pattern 100 and a second process for etching the SiN film 104. After completion of the trimming process, a line width of the resist pattern 100 was measured. Further, a mask selectivity of the SiN etching process was measured. In this test, a plasma processing apparatus (FIG. 13) of a lower side dual frequency application type was used.

Main conditions for the first process (BARC etching/resist modification) are described as follows.

Resist: acrylate based ArF resist
BARC: organic film
Processing gas: $CF_4/O_2$=250/13 sccm
Pressure in chamber: 30 mTorr, 100 mTorr (two types)
Temperature: upper electrode/chamber sidewall/lower electrode=60/60/30° C.
Radio frequency power: 40/13 MHz=400/0 W
DC voltage $V_{DC}$: 0 V, −1800 V (two types)
Processing time: 20 seconds, 47 seconds (two types)

Main conditions for the second process (SiN etching) are described as follows.

Processing gas: $CF_4/CHF_3/Ar/O_2$=225/12 5/600/60 sccm
Pressure in chamber: 75 mTorr
Temperature: upper electrode/chamber sidewall/lower electrode=60/60/30° C.
Radio frequency power: 60/13 MHz=100/1000 W
DC voltage $V_{DC}$: −300 V
Processing time: 30 seconds FIG. 17 offers SEM pictures showing cross sectional shapes of patterns obtained from the above test. In this test, the DC voltage $V_{DC}$ applied to the upper electrode 60 in the first process (BARC etching/resist modification), the gas pressure, and the processing time were used as parameters. At this time, a case (a) defined as main reference (STD) was performed under the conditions in which: $V_{DC}$ was 0 V; a gas pressure was about 30 mTorr; and processing time was about 20 seconds. Further, a case (b) defined as sub reference (STD') was performed under the conditions in which: $V_{DC}$ was about −1800 V; a gas pressure was about 30 mTorr; and processing time was about 20 seconds.

Figure 17:
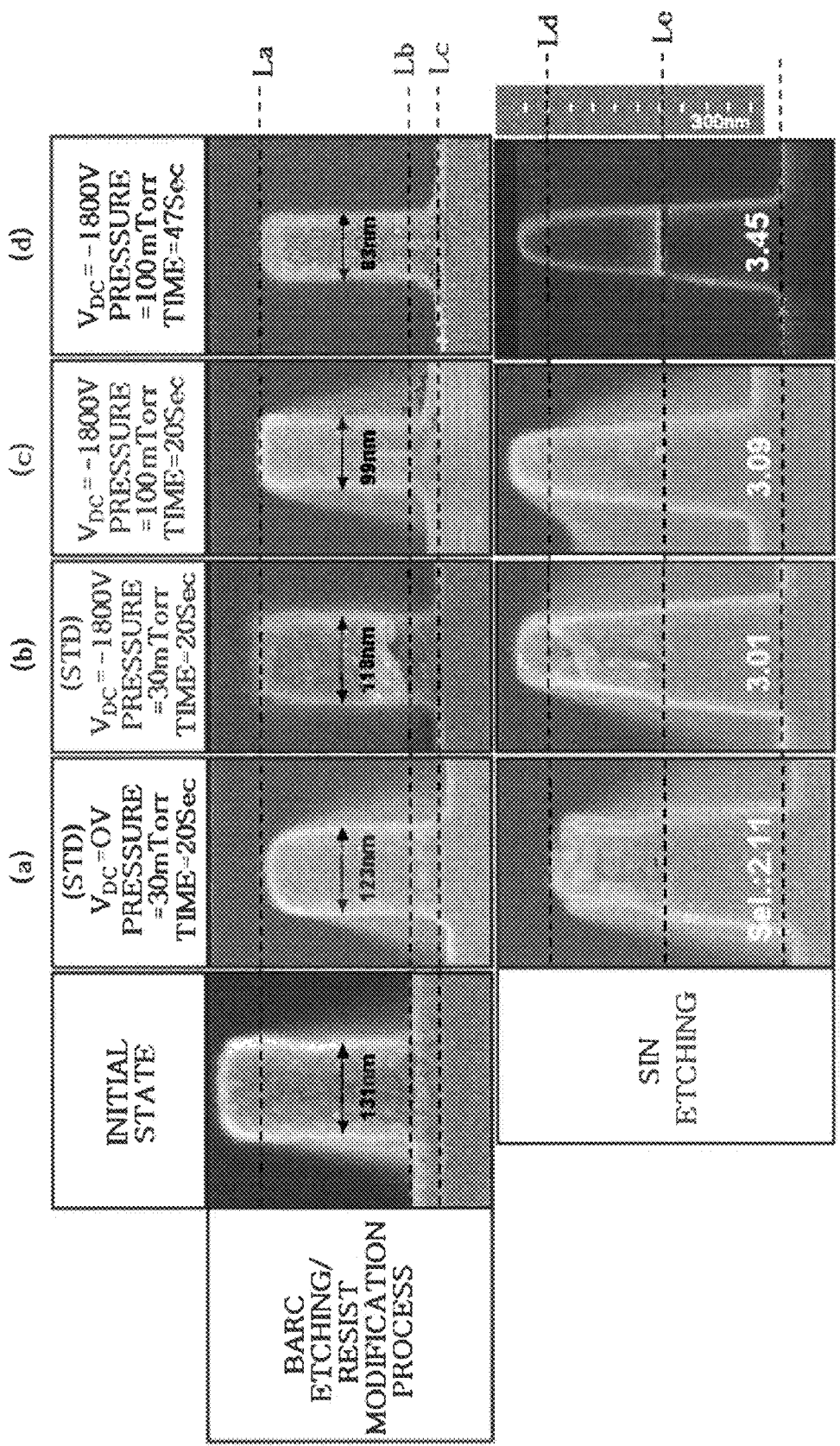
FIG. 17 offers SEM pictures of pattern cross sectional shapes obtained after completion of each process in a test of a third embodiment.

In FIG. 17, dotted lines $L_a$ and $L_c$ indicate a level of a top portion of the resist pattern 100 and a level of a top surface of the base layer (SiN film) 104 which were measured after completion of the first process in the main reference (STD), respectively. A dotted line $L_b$ represents a level of a top surface of the BARC 102 which was measured before the first process. Moreover, dotted lines $L_d$ and $L_e$ indicate a level of a top portion of the resist pattern 100 and a level of an interface between the BARC 102 and the SiN film 104 which were measured after completion of the second process in the main reference (STD), respectively.

As shown in an upper part of FIG. 17, the width of the resist pattern 100 was about 131 nm in an initial state. After completion of the first process, it was reduced to about 123 nm in the case (a); about 118 nm in the case (b); about 99 nm in the case (c) where $V_{DC}$ was about −1800 V, a gas pressure was about 100 mTorr and processing time was about 20 seconds; and about 83 nm in the case (d) where $V_{DC}$ was about −1800 V, a gas pressure was about 100 mTorr and processing time was about 47 seconds.

In the first process, it has been found that the trimming amount increased markedly by increasing the gas pressure and the processing time. Furthermore, it has been found that this did not cause any excessive loss in the vertical direction, so that a good pattern cross sectional shape having no shoulder-shape collapse was able to be obtained.

Here, the reason that the increase of the gas pressure increased the trimming amount of the resist 100 is considered because an etching rate in a horizontal direction by radicals was increased owing to increased fluorine radicals. Further, as the processing time increased, the etching amount of the horizontal direction increased in proportion thereto.

Moreover, the reason why the etching amount of the vertical direction did not increase despite the increase of the etching amount of horizontal direction in the resist pattern 100 is considered because the degree of modification in the horizontal direction was different from that in the vertical direction. In other words, due to the resist modification process of the present invention, high-energy electrons were injected into the resist pattern 100 on the surface of the semiconductor wafer W in a substantially vertical direction, which was further helped by the fact that ions were also injected in a substantially vertical direction. Subsequently, the resist pattern 100 was modified intensely in a vertical direction than in a horizontal direction. Besides, the peripheral portion (edge) of the resist pattern 100 was easily etched due to the ion concentration thereat, and subsequently the peripheral portion met with the vertical side wall of the resist pattern 100.

In the first process, the first radio frequency power HF for plasma generation was applied to the susceptor (lower electrode) 12, whereas the second radio frequency power LF for ion attraction was not applied thereto. However, the self-bias occurred due to the application of the first radio frequency power HF so that the positive ions in the plasma were attracted to the semiconductor wafer W by the electric field of the ion sheath and then entered into the resist pattern 100.

As shown in a lower part of FIG. 17, the mask selectivity in the second process was about 2.11 under the condition (a); about 3.01 under the condition (b); about 3.09 under the condition (c); and about 3.45 under the condition (d). From the above result, it has been found that $V_{DC}$ (whose absolute value is greater than or equal to about 1500 V) is a dominant condition to improve the mask selectivity, i.e., to increase the etching resistance of the resist pattern 100. In addition, it has also been found that as the processing time of the first process increases, the mask selectivity is improved, and the etching resistance of the resist pattern 100 is further enhanced.

Figure 18:
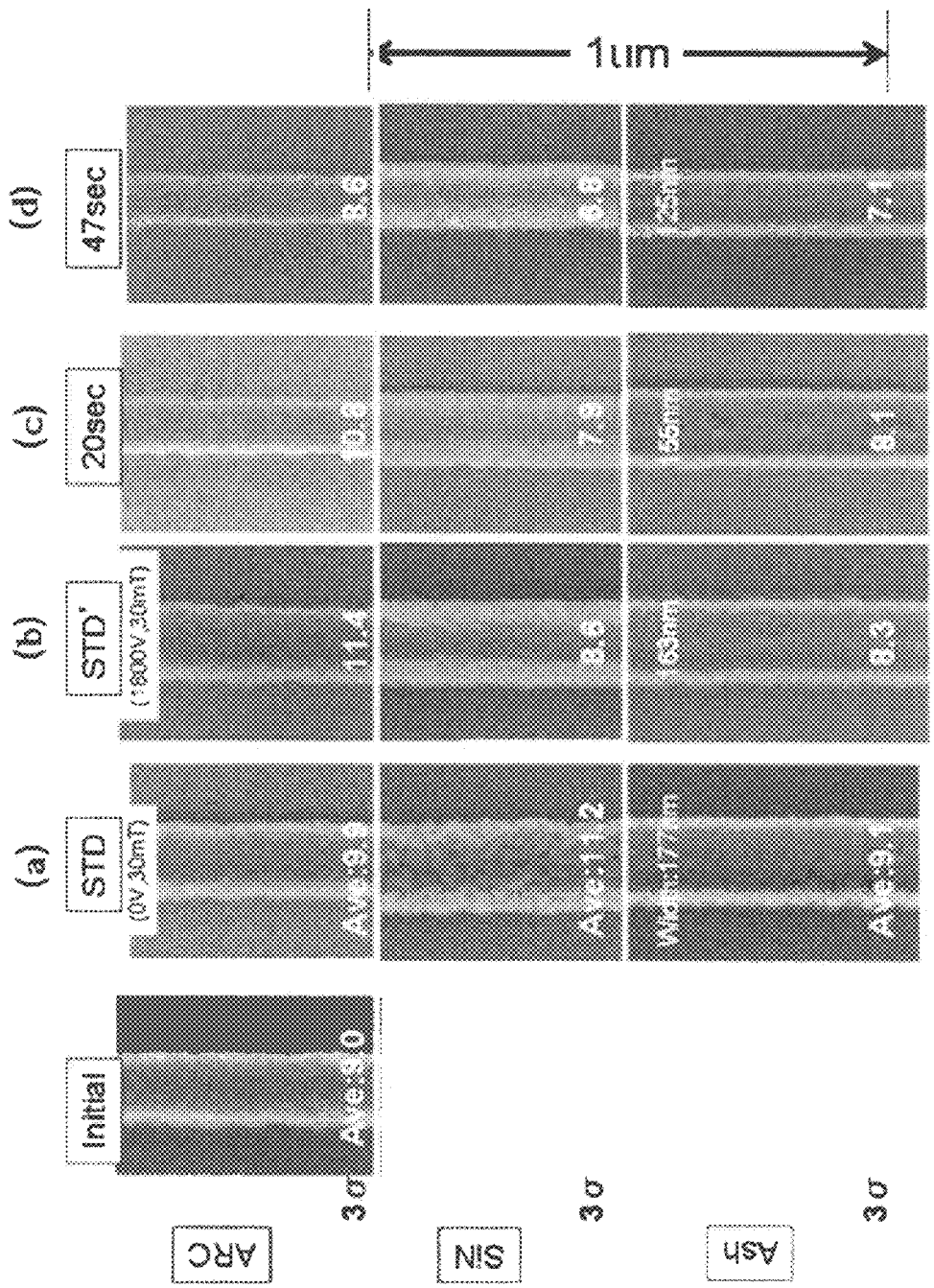
FIG. 18 sets forth SEM pictures of plane shapes of patterns in each step in the third embodiment.

FIG. 18 offers, as a test result in the present embodiment, an SEM picture of a resist pattern [ARC] obtained after completion of the first process, a resist pattern [SiN] obtained after completion of the second process and an SiN pattern [Ash] obtained after completion of ashing. As illustrated, under the conditions (c) and (d), the pressure in the first process is high in any stage. Therefore, it is possible to observe that the flatness of the pattern sidewall is improved as the processing time increases.

The LWR (3δ) of the SiN pattern [Ash] as a final mask was about 9.1 under the condition (a); about 8.3 under the condition (b); about 8.1 under the condition (c); and about 7.1 under the condition (d).

Figure 19:
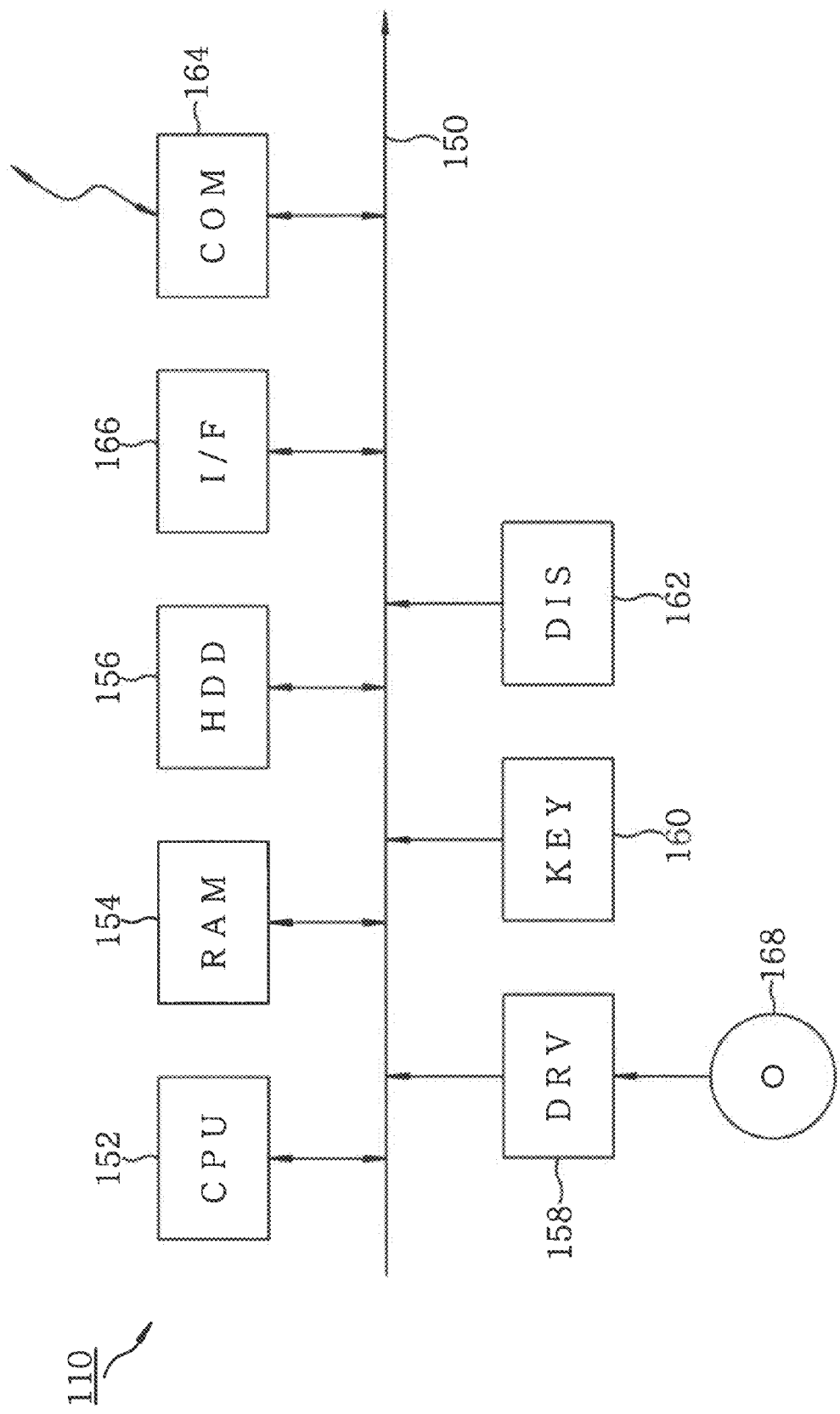
FIG. 19 is a block diagram showing a configuration example of a control unit in the embodiment of the present invention.

FIG. 19 depicts a configuration example of the control unit 110 for controlling an entire sequence and an operation of each unit in the plasma processing apparatus (see FIGS. 1 and 13) for performing the plasma etching method of the above embodiment.

The control unit 110 of the configuration example includes a processor (CPU) 152 connected thereto via a bus 150, a memory (RAM) 154, a program storage unit (HDD) 156, a disk drive (DRV) 158 such as a floppy drive, an optical disk or the like, an input device (KEY) 160 such as a keyboard, a mouse or the like, a display device (DIS) 162, a network interface (COM) 164 and a peripheral interface (I/F) 166.

The processor (CPU) 152 reads a code of a required program from a storage medium 168 such as a floppy disk (FD), an optical disk or the like installed in the disk drive (DRV) 158, and stores the read code in the HDD 156. Or, a required program may be downloaded from a network via the network interface 164. Further, the processor (CPU) 152 loads a program required at each step or each moment from the HDD 156 into the working memory (RAM) and performs a corresponding step of the program while processing required operation so that a corresponding unit in the apparatus (especially, the gas exhaust unit 26, the radio frequency power supplies 30 and 74, the processing gas supply unit 72, the variable DC power supply 80, the on/off switch 82 and the like) is controlled via the peripheral interface 166. The program for performing the plasma etching method of the above embodiment is executed in this computer system.

In the above embodiment, the upper electrode 60 is used as a DC application member. However, in the present invention, any conductive member exposed to a plasma while facing the susceptor in a vertical direction or an oblique direction in the chamber may be used or used together with the upper electrode 60. For example, a chamber sidewall or the like other than the upper electrode 60 may be used as a DC voltage application member. A DC voltage applied to the DC voltage application member may not be necessarily maintained at a constant level. For example, an AC voltage of a low frequency may be superposed.

A substrate to be processed in the present invention is not limited to a semiconductor wafer, and may be selected from various substrates for use in a flat panel display, a photomask, a CD substrate, a printed circuit board, and the like. Moreover, although the present invention is suitable for a plasma etching process using an ArF resist, it can also be applied to a plasma etching process using another resist, another plasma processing or microprocessing.

While the invention has been shown and described with respect to the embodiments, it will be understood by those skilled in the art that various changes and modification may be made without departing from the scope of the invention as defined in the following claims.

What is claimed is:

1. A plasma etching method comprising:
   disposing a first electrode and a second electrode in parallel to each other with a gap therebetween in a vacuum evacuable processing chamber;
   preparing a part in the processing chamber;
   supporting a substrate to be processed by the second electrode to face the first electrode;
   vacuum-evacuating the processing chamber to a predetermined pressure;
   supplying a first processing gas containing an etchant gas into a processing space between the first electrode and the second electrode;
   generating a plasma of the first processing gas in the processing space by applying a radio frequency power to the first electrode or the second electrode; and
   etching a film to be processed on the substrate by using the plasma while using as a mask a resist pattern formed on the film,
   wherein a resist modification process is performed on the substrate in the processing chamber before etching the film and includes:
   vacuum-evacuating the processing chamber to a desired pressure;
   supplying a second processing gas into the processing space;
   generating a plasma of the second processing gas in the processing space by applying the radio frequency power to the first electrode or the second electrode; and
   applying a negative DC voltage to the part exposed to the plasma, the part being disposed away from the substrate in the processing chamber and injecting electrons discharged from the part into the resist pattern on the substrate to thereby improve an etching resistance of the resist pattern,
   wherein the part includes a sidewall of the processing chamber.

2. The plasma etching method of claim 1, wherein in the resist modification process, an absolute value of the negative DC voltage is selected so as to inject the electrons discharged from the part into the resist pattern at an energy greater than or equal to about 1000 eV.

3. The plasma etching method of claim 1, wherein an absolute value of the negative DC voltage is selected to be greater or equal to about 1000 V.

4. The plasma etching method of claim 1, wherein in the resist modification process, an absolute value of the negative DC voltage is selected so as to inject the electrons discharged from the part into the resist pattern at an energy greater than or equal to about 1500 eV.

5. The plasma etching method of claim 1, wherein an absolute value of the negative DC voltage is selected to be greater or equal to about 1500 V.

6. The plasma etching method of claim 1, wherein in the resist modification process, the radio frequency power for plasma generation is applied to the first electrode, and an additional radio frequency power for ion attraction is applied to the second electrode to form a self-bias lower than or equal to about 100 V on the second electrode.

7. The plasma etching method of claim 1, wherein in the resist modification process, the radio frequency power for plasma generation is applied to the first electrode, and an additional radio frequency power for ion attraction is applied to the second electrode at a power lower than or equal to about 50 W.

8. The plasma etching method of claim 1, wherein in the resist modification process, the radio frequency power for plasma generation is applied to the first electrode without applying a radio frequency power to the second electrode.

9. The plasma etching method of claim 1, wherein a trimming process for trimming the resist pattern in the processing chamber in a horizontal direction in parallel with a pattern surface is performed between the resist modification process and the etching process of the film.

10. The plasma etching method of claim 9, wherein the trimming process includes:
    vacuum-evacuating the processing chamber;
    supplying a third processing gas containing an etchant gas into the processing space;
    generating a plasma of the third processing gas in the processing space by applying the radio frequency to the first electrode or the second electrode; and
    etching the resist pattern in a desired size by using the plasma.

11. The plasma etching method of claim 1, wherein the part is the first electrode.

12. The plasma etching method of claim 1, wherein a surface of the first electrode which is exposed to the plasma is made of a Si-containing conductive material, and the second processing gas contains a halogen gas.

13. The plasma etching method of claim 1, wherein the resist pattern includes a resist using an ArF excimer laser beam as an exposure beam.

14. A plasma etching method comprising:
    disposing a first electrode and a second electrode in parallel to each other with a gap therebetween in a vacuum evacuable processing chamber;
    preparing a part in the processing chamber;
    supporting a substrate to be processed by the second electrode to face the first electrode;
    vacuum-evacuating the processing chamber to a predetermined pressure;
    supplying a processing gas containing an etchant gas into a processing space between the first electrode and the second electrode;
    generating a plasma of the etching gas in the processing space by applying a radio frequency to the first electrode or the second electrode; and
    etching a film to be processed on the substrate by using the plasma while using as a mask a resist pattern formed on the film,
    wherein while the film is being etched in the processing chamber, a negative DC voltage is applied to the part exposed to the plasma, the part being disposed away from the substrate in the processing chamber and electrons discharged from the part are injected into the resist pattern to thereby improve an etching resistance of the resist pattern, and wherein a gas pressure in the processing chamber and etching time are selected so as to etch the resist pattern in a desired size in a horizontal direction in parallel with a pattern surface during etching the film.

15. The plasma processing method of claim 14, wherein an absolute value of the negative DC voltage is selected so as to inject the electrons discharged from the part into the resist pattern at an energy greater than or equal to about 1500 eV.

16. The plasma processing method of claim 14, wherein the radio frequency power for plasma generation is applied to the first electrode, and an additional radio frequency power for ion attraction is applied to the second electrode.

17. The plasma processing method of claim 14, wherein the first radio frequency power for plasma generation and an additional radio frequency power for ion attraction are superposedly applied to the second electrode.

18. The plasma etching method of claim 14 wherein the part is the first electrode.

19. The plasma etching method of claim 14, wherein while etching the film, trimming of the resist pattern is simultaneously performed.

20. The plasma etching method of claim 19, wherein the film is a bottom anti-reflection coating (BARC), and the method further comprising etching a SiN film formed under the BARC using the resist pattern as a mask after etching the film.

21. The plasma etching method of claim 19, wherein the gas pressure in the processing chamber is about 100 mTorr, the etching time is about 47 seconds and the negative DC voltage is about −1800 V during etching the film.

* * * * *